United States Patent
Iwai et al.

(10) Patent No.: US 9,608,523 B1
(45) Date of Patent: Mar. 28, 2017

(54) REGULATOR, SERIALIZER, DESERIALIZER, SERIALIZER/DESERIALIZER CIRCUIT, AND METHOD OF CONTROLLING THE SAME

(71) Applicant: Kabushiki Kaisha Toshiba, Minato-ku, Tokyo (JP)

(72) Inventors: Takayuki Iwai, Setagaya Tokyo (JP); Yasushi Shizuki, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/066,563

(22) Filed: Mar. 10, 2016

(30) Foreign Application Priority Data

Sep. 14, 2015 (JP) .................................. 2015-181192

(51) Int. Cl.
| | |
|---|---|
| H03M 9/00 | (2006.01) |
| H02M 3/158 | (2006.01) |
| H03L 7/08 | (2006.01) |
| H03K 21/02 | (2006.01) |
| H04L 7/033 | (2006.01) |
| G06F 1/08 | (2006.01) |
| H03K 7/06 | (2006.01) |
| H04L 27/26 | (2006.01) |
| H03K 23/68 | (2006.01) |
| G06F 1/10 | (2006.01) |

(52) U.S. Cl.
CPC ............ *H02M 3/158* (2013.01); *H03K 21/02* (2013.01); *H03L 7/0807* (2013.01); *H03M 9/00* (2013.01); *G06F 1/08* (2013.01); *G06F 1/10* (2013.01); *H03K 7/06* (2013.01); *H03K 23/68* (2013.01); *H04L 7/033* (2013.01); *H04L 7/0337* (2013.01); *H04L 27/2647* (2013.01)

(58) Field of Classification Search
CPC ...... H03M 9/00; H04L 7/033; H04L 27/2647; H04L 7/0337; G06F 1/10; G06F 1/08; H03K 7/06; H03K 23/68
USPC ........ 341/100, 101; 375/373, 316, 355, 356; 327/114, 115, 296
See application file for complete search history.

(56) References Cited

U.S. PATENT DOCUMENTS

| | | | |
|---|---|---|---|
| 2002/0114416 A1* | 8/2002 | Enam ................... | H03D 7/1433 375/373 |
| 2014/0300191 A1 | 10/2014 | Matsubara | |
| 2015/0048809 A1 | 2/2015 | Teraguchi | |

FOREIGN PATENT DOCUMENTS

JP 2002-261242 A 9/2002

* cited by examiner

*Primary Examiner* — Joseph Lauture
(74) *Attorney, Agent, or Firm* — White & Case LLP

(57) ABSTRACT

According to an embodiment, a regulator includes: a voltage control circuit to supply a voltage; a clock signal output circuit to output a clock signal controlled by the voltage supplied from the voltage control circuit; and a current control circuit to supply the voltage supplied from the voltage control circuit to the clock signal output circuit, the current control circuit make to flow a dummy current which is determined based on the voltage, and stopping flowing the dummy current at a timing when the clock signal output circuit outputs the clock signal.

17 Claims, 20 Drawing Sheets

REGULATOR, SERIALIZER, DESERIALIZER, SERIALIZER/DESERIALIZER CIRCUIT, AND METHOD OF CONTROLLING THE SAME

CROSS REFERENCE TO RELATED APPLICATIONS

This application is based upon and claims the benefit of priority from the prior Japanese Patent Application No. 2015-181192, filed on Sep. 14, 2015, the entire contents of which are incorporated herein by reference.

FIELD

Embodiments described herein relate generally to a regulator, a serializer, a deserializer, a serializer/deserializer circuit, and a method of controlling the same.

BACKGROUND

In a serializer/deserializer (SerDes) circuit, in order to correctly transmit a signal to be converted, transmitters (TX) constituting lanes needs to be synchronized accurately. For example, when parallel signals are converted into serial signals, parallel signals inputted to the transmitters constituting lanes need to be synchronized appropriately. One method to distribute signals appropriately to the transmitters is to synchronize by using a high-speed clock signal having the same frequency as the frequency of the serial signals. When a synchronization signal is asserted for the transmitters, the high-speed clock signal with the same frequency as the frequency of the serial signals is transmitted to the transmitters.

At this time, paths for the high-speed clock signal become effective all at once, and hence a load current flowing through the circuits increases rapidly. Then the voltage of a low drop out (LDO) voltage regulator drops largely, deteriorating quality of the high-speed clock signal. By this deterioration in quality of the high-speed clock signal, a divider of each transmitter may consequently become unable to divide the clock signal correctly, which may result in a failure of the synchronization. Further, not only does the voltage of the regulator on the side transmitting the clock signal drops, but also the voltage on the transmitter side drops because the load current increases similarly in the regulator on each transmitter side.

In order to prevent this drop in voltage, it is conceivable to place a stabilization circuit to stabilize the voltage. However, placing the stabilization circuit raises a concern that the area of the entire SerDes circuit increases by the area occupied by the stabilization circuit.

DETAILED DESCRIPTION

According to an embodiment, a regulator includes: a voltage control circuit to supply a voltage; a clock signal output circuit to output a clock signal controlled by the voltage supplied from the voltage control circuit; and a current control circuit to supply the voltage supplied from the voltage control circuit to the clock signal output circuit, the current control circuit make to flow a dummy current which is determined based on the voltage, and stopping flowing the dummy current at a timing when the clock signal output circuit outputs the clock signal.

Embodiments will now be explained with reference to the accompanying drawings. The present invention is not limited to the embodiments.

First Embodiment

A serializer according to a first embodiment controls a current outputted by a regulator controlling a voltage of an input signal, so as to avoid a drop of a regulator voltage which controls the voltage of the input signal. Details will be described below.

Figure 1:
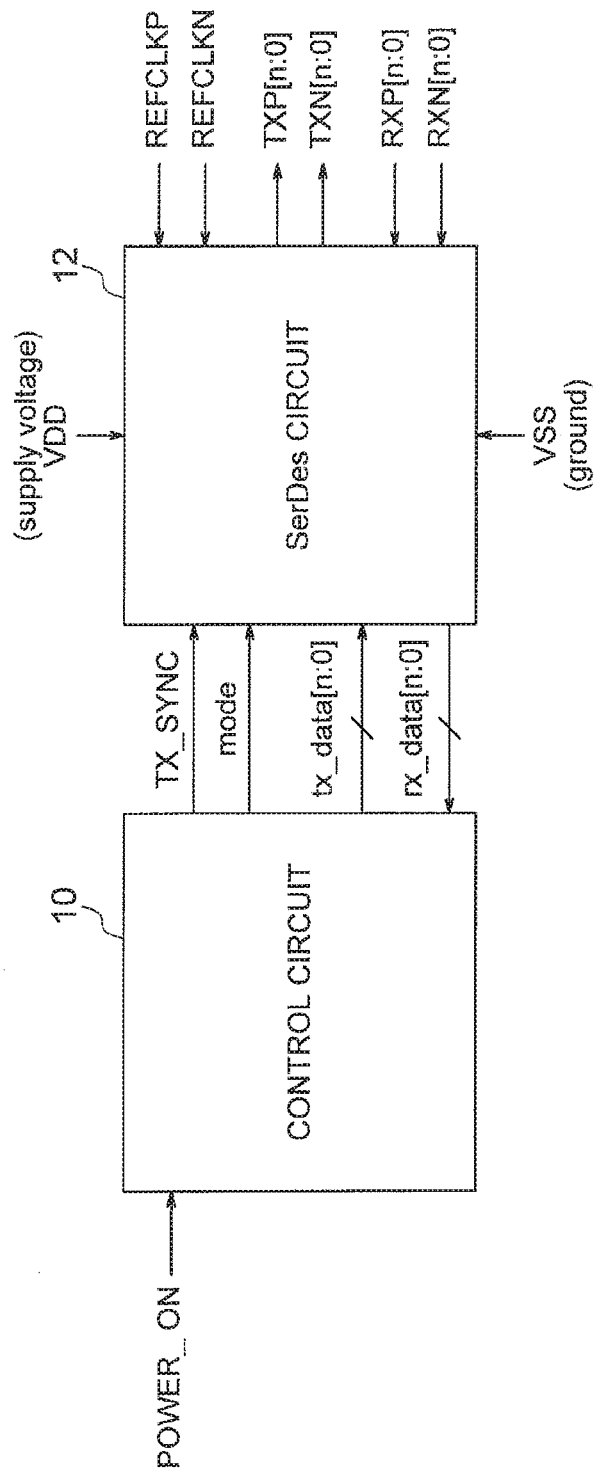
FIG. 1 is a diagram illustrating an example of a serial signal-parallel signal conversion device including a serializer/deserializer circuit.

FIG. 1 is a diagram illustrating an example of a mode of usage of a serializer/deserializer circuit using a serializer according to this embodiment. The serial signal-parallel signal conversion device 1 illustrated in FIG. 1 includes a control circuit 10 and a serializer/deserializer (SerDes) circuit 12. This serial signal-parallel signal conversion device 1 converts parallel transmission data tx_data into serial differential transmission signals TXP/TXN and transmits the converted signals, and also converts serial differential reception signals RXP/RXN into parallel reception data rx_data.

The control circuit 10 is connected to a power supply and transmits a synchronization signal TX_SYNC and a mode signal Mode for controlling the SerDes circuit 12. Further, the control circuit 10 transmits parallel transmission data tx_data to the SerDes circuit 12 and receives parallel reception data rx_data from the SerDes circuit 12.

Based on the synchronization signal TX_SYNC and the mode signal Mode which are inputted from the control circuit 10, the SerDes circuit 12 converts the parallel transmission data tx_data inputted likewise from the control circuit 10 into serial differential transmission signals TXP/TXN in a transmitter provided in the SerDes circuit 12, and transmits the converted signals. Similarly, the SerDes circuit 12 converts serial differential reception signals RXP/RXN received from the outside into parallel reception data rx_data in a receiver (RX) provided in the SerDes circuit 12, and outputs the converted data to the control circuit. At this time, each signal in each circuit of the SerDes circuit 12 is controlled to a voltage based on VDD and VSS by a regulator. Further, the clock frequency of each signal is controlled based on differential reference clocks CLKREFP/CLKREFN given from the outside. This embodiment is related to transmitters, and hence control related to transmitters will be described in detail below.

Figure 2:
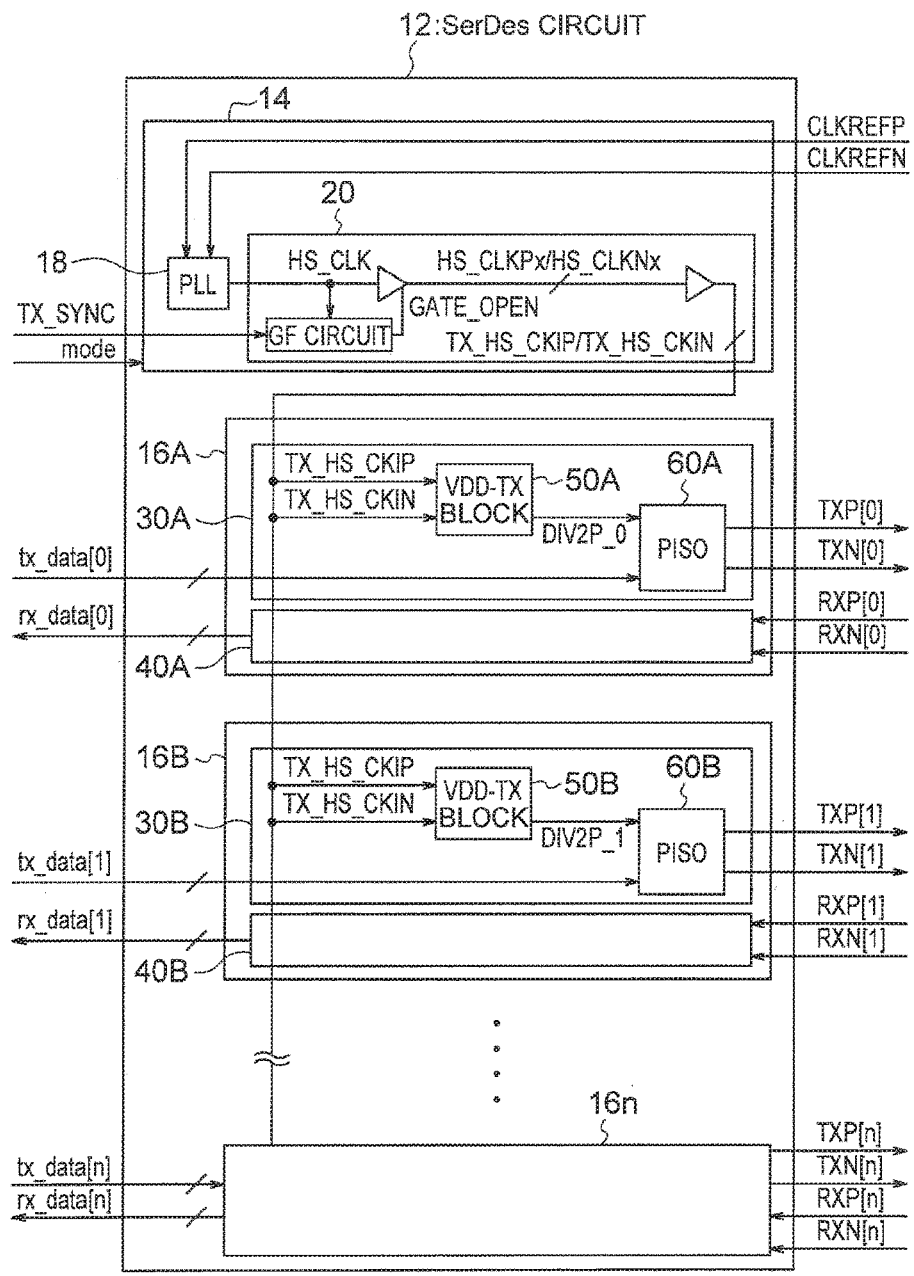
FIG. 2 is a diagram illustrating an example of circuits illustrating a configuration of the serializer/deserializer circuit.

FIG. 2 is a diagram illustrating a circuit configuration of the SerDes circuit 12 illustrated in FIG. 1. The SerDes circuit 12 includes a common block (COM) 14 distributing an inputted clock signal to lanes of transmitters, and lanes 16A, B, . . . , n. The common block 14 includes a phase locked loop (PLL) 18 and a VDD_CKDIST block 20. The PLL 18 synchronizes phases of reference clock signals from the outside to generate a high-speed clock HS_CLK. The VDD_CKDIST block 20 is a circuit block operating with a regulator voltage VDD_CKDIST.

The lane 16A includes a transmitter 30A which is a circuit transmitting data and a receiver 40A which is a circuit receiving data. The transmitter 30A includes a VDD_TX block 50A and a parallel-in, serial-out shift register (PISO) 60A. The VDD_TX block 50A is a circuit block operating with a regulator voltage VDD_TX to divide a clock signal. Further, the PISO 60A is a circuit converting parallel transmission data into serialized differential transmission signals.

The lanes 16B, . . . , 16n have the same configuration as the lane 16A. Specifically, the lane 16n includes a transmitter 30n and a receiver 40n, and the transmitter 30n includes a VDD_TX block 50n and a PISO 60n.

Next, operation of the SerDes circuit 12 will be described. Note that details of the VDD_CKDIST block 20 and the VDD_TX block 50 will be described later and hence other components will be described. First, differential reference clocks CLKREFP/CLKREFN inputted from the outside are inputted to the PLL 18 in the common block 14. The PLL 18 synchronizes phases of the inputted clock signals to generate a high-speed clock signal HS_CLK. The frequency of this high-speed clock signal HS_CLK is to be the clock frequency of a signal for transmitting or receiving data. The high-speed clock signal HS_CLK outputted by the PLL 18 is inputted to the VDD_CKDIST block 20, and converted at a timing when the synchronization signal TX_SYNC is inputted from the control circuit 10 into differential high-speed clock signals TX_HS_CKIP/TX_HS_CKIN with controlled qualities such as voltage and slew.

The differential high-speed clock signals TX_HS_CKIP/TX_HS_CKIN with controlled qualities such as voltage and slew are inputted to the lane 16A. In the lane 16A, the controlled differential high-speed clock signals TX_HS_CKIP/TX_HS_CKIN are transmitted to the VDD_TX block 50A. Thereafter, the controlled differential high-speed clock signals TX_HS_CKIP/TX_HS_CKIN are outputted from the lane 16A.

In the VDD_TX block 50A, the controlled differential high-speed clock signals TX_HS_CKIP/TX_HS_CKIN are divided to generate a clock signal DIV2P_0 for converting parallel transmission data tx_data[0] into serial signals. The PISO 60A converts the parallel transmission data tx_data[0] inputted from the control circuit 10 into serial differential transmission signals TXP[0]/TXN[0] based on this DIV2P_0 signal, and transmits the converted signals to the outside.

On the other hand, the differential high-speed clock signals TX_HS_CKIP/TX_HS_CKIN with controlled qualities such as voltage and slew outputted from the lane 16A are inputted to the lane 16B. Signal conversion similar to that in the lane 16A is performed in the lane 16B. That is, in the VDD_TX block 50B, the differential high-speed clock signals TX_HS_CKIP/TX_HS_CKIN with a controlled voltage are divided to generate DIV2P_1, and tx_data[1] are converted into serial differential transmission signals TXP[1]/TXN[1] with reference to the DIV2P_1 and then transmitted to the outside. Thereafter, similar conversion is performed up to the lane 16n.

Figure 3:
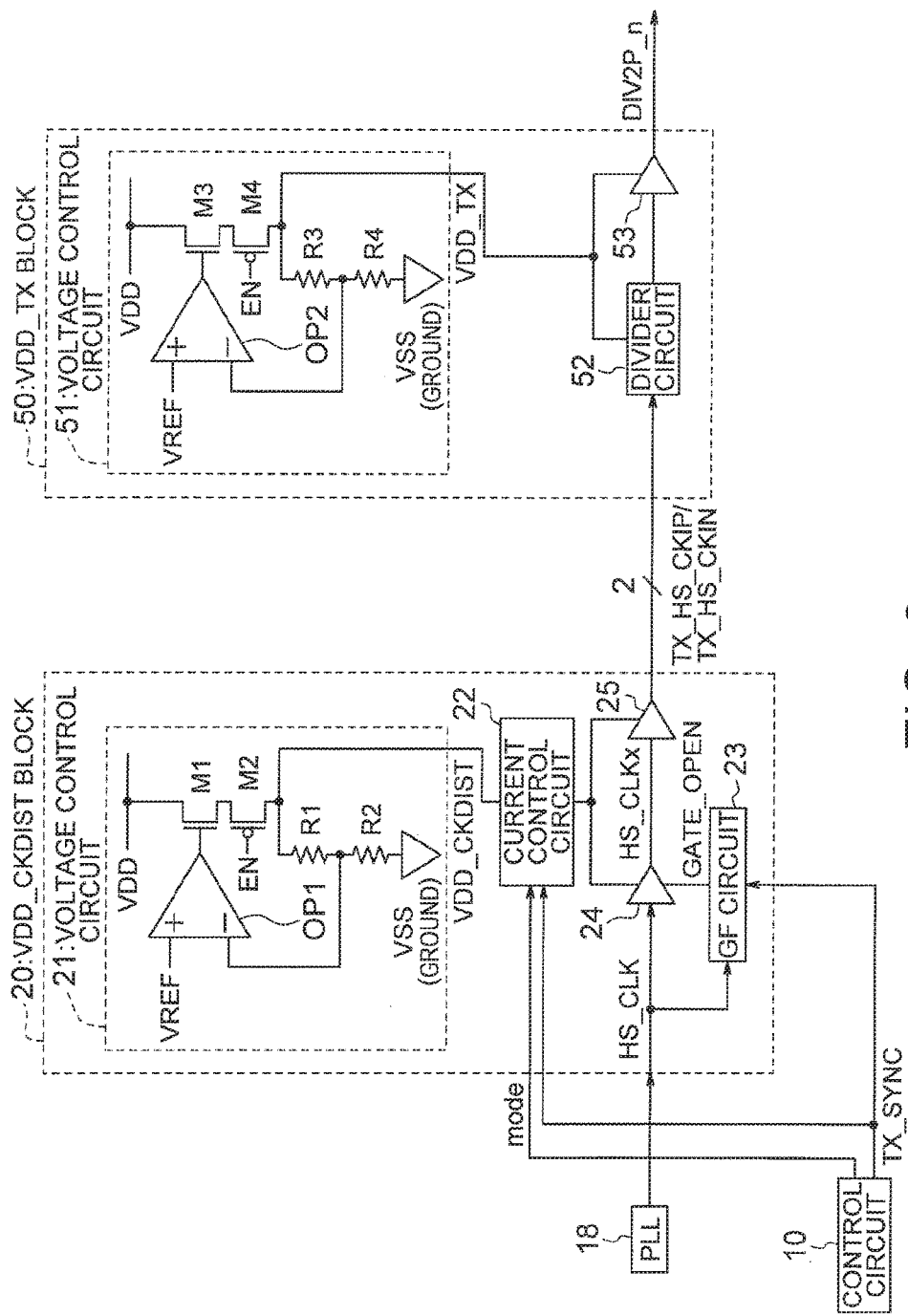
FIG. 3 is a diagram illustrating circuits of a regulator according to a first embodiment.
Figure 4:
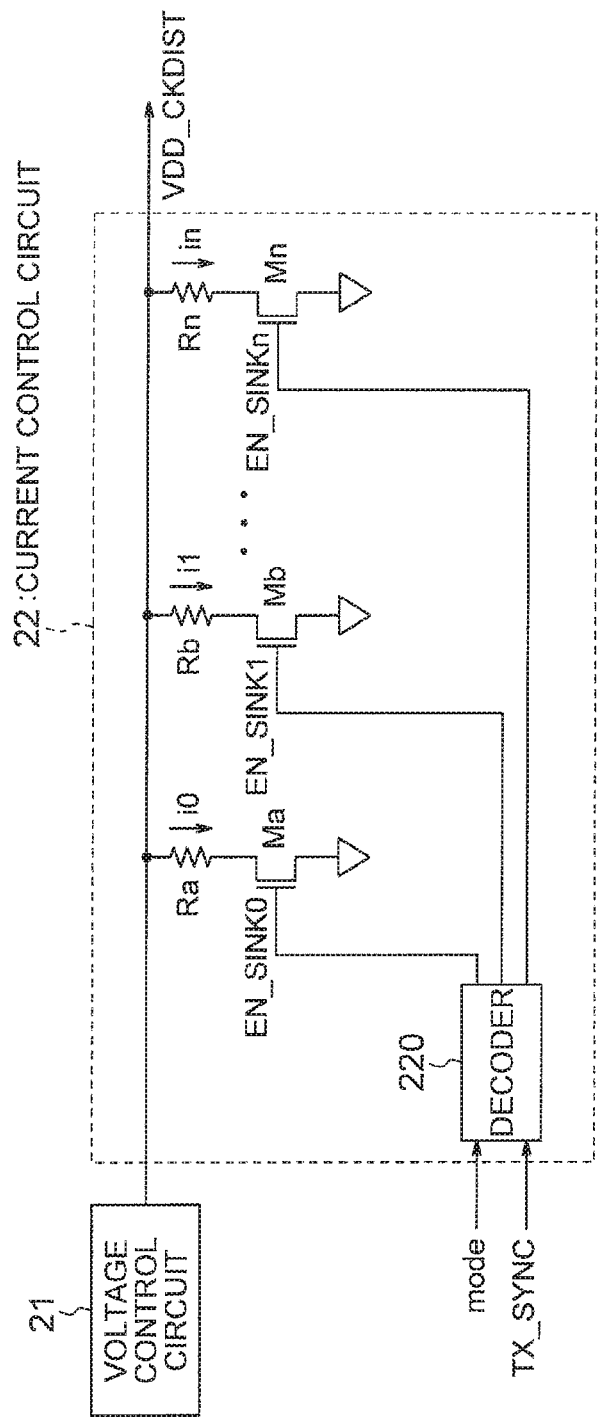
FIG. 4 is a diagram illustrating a voltage control circuit according to the first embodiment.

Next, a configuration of a regulator according to this embodiment will be described using FIG. 3 and FIG. 4. Since the lanes 16A, 16B, . . . , 16n have the same configuration, one of these lanes will be explained below with its suffix being omitted. FIG. 3 is a diagram illustrating configurations of the VDD_CKDIST block 20 and the VDD_TX block 50 in FIG. 2. The VDD_CKDIST block 20 is a circuit block operating with a regulator voltage VDD_CKDIST, and includes a voltage control circuit 21, a current control circuit 22, a glitch-free circuit 23, a clock signal output circuit 24, and a buffer 25. One VDD_TX block 50 is a circuit block operating with a regulator voltage VDD_TX, and includes a voltage control circuit 51, a divider circuit 52, and a buffer 53.

The voltage control circuit 21 is connected to the current control circuit 22 for controlling voltage, and includes an operational amplifier OP1, an nMOS element M1, a pMOS element M2, and resistors R1, R2. Specifically, the voltage control circuit 21 is configured such that a constant voltage circuit is formed by applying a reference voltage to an input (+) terminal of the operational amplifier OP1 and a negative feedback voltage to an input (−) terminal of the same, a current is controlled by the nMOS element M1, and a voltage is outputted when an enable signal is given from the pMOS element M2. Note that although an example is specifically given as the voltage control circuit 21 in FIG. 3, any configuration may be employed as long as it is a circuit generating a typical regulator voltage.

The current control circuit 22 is connected to the voltage control circuit 21, the control circuit 10, the clock signal output circuit 24, and the buffer 25, and is a circuit for suppressing a drop of the voltage VDD_CKDIST which occurs when the lanes 16A, 16B, . . . , 16n are synchronized. FIG. 4 is a diagram illustrating an example of the current control circuit 22. The current control circuit 22 will be described using this FIG. 4. The current control circuit 22 controls a current based on the voltage outputted from the voltage control circuit 21. And the current control circuit 22 supplies a voltage to the clock signal output circuit 24 and the buffer 25. This current control circuit 22 consumes a dummy current in advance based on the voltage outputted by the voltage control circuit 21, and stops consuming the dummy current at a timing when the clock signal output circuit 24 outputs a clock. Note that the dummy current mentioned here refers to a current allowed to flow to the ground to be consumed from the current flowing through the circuits based on the regulator voltage to minimize transient voltage drop when a load is added to the regulator, until a timing when the synchronization signal TX_SYNC is asserted. Hereinafter, consuming the dummy current refers to decreasing the current in the circuits in advance by allowing some of the current to flow to the ground.

More specifically, the current control circuit 22 includes a decoder 220, resistors Ra, Rb, . . . , Rn, and nMOS elements Ma, Mb, . . . , Mn. The resistor Ra and the nMOS element Ma are connected in series, and moreover, the source side of the nMOS element Ma is grounded to constitute a circuit for consuming the dummy current. The resistor Rb and the nMOS element Mb, . . . , and the resistor Rn and the nMOS element Mn are similarly connected in series, and the source side of the nMOS element is grounded to constitute a dummy current consumption circuit (a dummy current flowing circuit).

These dummy current consumption circuits are provided in parallel to the output of the voltage control circuit 21. The decoder 220 is a dummy current consumption control circuit (a dummy current flowing control circuit), and determines which resistor should flow the dummy current from information of the mode signal Mode, so as to control dummy current consumption. That is, the current control circuit 22 includes one or more dummy current consumption circuits for the output of the voltage control circuit 21.

Referring back to FIG. 3, other components will be described. The glitch-free circuit 23 is connected to the control circuit 10, the PLL 18, and the clock signal output circuit 24, for avoiding a glitch of a high-speed clock signal HS_CLKx. Specifically, the glitch-free circuit 23 outputs a gate open signal GATE_OPEN to open the gate circuit 24 at a timing when the glitch does not occur in the high-speed clock signal HS_CLKx according to the synchronization signal TX_SYNC.

The clock signal output circuit 24 is connected to the PLL 18, the current control circuit 22, the glitch-free circuit 23, and the buffer 25 and is, for example, a NAND gate or a clocked inverter and switches on/off of the clock output according to the gate signal GATE_OPEN outputted from the glitch-free circuit 23. Then, in a state of outputting a clock, the clock signal output circuit 24 outputs the inputted high-speed clock signal HS_CLK as the high-speed clock signal HS_CLKx based on the voltage VDD_CKDIST.

The buffer circuit 25 is connected to the current control circuit 22 and the clock signal output circuit 24, and outputs an inputted clock signal HS_CLK of one phase based on the voltage VDD_CKDIST. This buffer circuit 25 converts the high-speed clock signal HS_CLKx which is one phase into differential high-speed clock signals TX_HS_CKIP/TX_HS_CKIN of two phases. Incidentally, the buffer circuit 25 is for adjusting a clock signal to be transmitted to the transmitter, and may be omitted as long as qualities such as voltage and slew of the clock outputted by the clock signal output circuit 24 in the preceding stage are of sufficient values. In this case, the high-speed clock signal HS_CLKx needs to be converted into the clock signals TX_HS_CKIP/TX_HS_CKIN of two phases in the clock signal output circuit 24.

The VDD_TX block 50 is a circuit block operating with the regulator voltage VDD_TX, dividing the differential high-speed clock signals TX_HS_CKIP/TX_HS_CKIN when they are inputted, and outputting a clock signal DIV2P. The VDD_TX block 50 includes a voltage control circuit 51, a divider circuit 52, and a buffer 53. The voltage control circuit 51 has a configuration similar to that of the voltage control circuit 21, includes an operational amplifier OP2, an nMOS element M3, a pMOS element M4, and resistors R3, R4, and controls the regulator voltage VDD_TX. The divider circuit 52 is connected to the buffer 25 and the voltage control circuit 51, and divides the inputted clock signals TX_HS_CKIP/TX_HS_CKIN. The buffer 53 is connected to the voltage control circuit 51 and the divider circuit 52 for controlling qualities such as voltage and slew of the clock outputted by the divider circuit, and may be omitted similarly to the buffer 25 as long as qualities such as voltage and slew of the signal outputted by the divider circuit are of sufficient values.

This concludes the description of the configuration of the serializer according to this embodiment. Hereinafter, operation of the serializer according to this embodiment will be described using FIG. 3 and FIG. 4 described above. First, the voltage control circuit 21 of the VDD_CKDIST block 20 controls a reference voltage VREF from the power supply in the SerDes circuit 12 for the voltage VDD_CKDIST based on the voltage VDD and the voltage VSS applied from the outside.

The current control circuit 22 controls the amount of current by allowing the dummy current to flow from the voltage outputted by the voltage control circuit 21 based on the mode signal Mode inputted from the control circuit 10. Here, the mode signal Mode is a signal generated based on, for example, the information of frequency of the clock signal HS_CLK. In this case, the current control circuit 22 selects a plurality of circuits consuming the dummy current based on the clock frequency of the clock signal, and controls the selected circuits consuming the dummy current to consume the dummy current. Operation of the current control circuit 22 will be described using FIG. 4.

The inputted mode signal Mode is converted into a control signal by the decoder 220. The decoder 220 applies a voltage equal to or higher than a threshold Vth to an nMOS element which turns on according to the control signal. For example, if a voltage EN_SINK0 equal to or higher than the threshold Vth for turning on the nMOS element Ma is applied to the nMOS element Ma, the nMOS element Ma turns on, and the dummy current flows to the ground via the resistor Ra. The number of nMOS elements to turn on is determined by the information of frequency of the clock signal and/or the like, and the decoder 220 outputs a voltage so that a voltage EN_SINK is applied to the gate of the nMOS element which needs to be on. The amount of consumption of the dummy current to flow is controlled based on the amount of load current generated by that the path of the high-speed clock signal HS_CLK is enabled for the plurality of transmitters 30 constituting lanes when the synchronization signal TX_SYNC is asserted from the control circuit 10. In other words, the dummy current is determined based on the load current when the current control circuit 22 does not control a current from the voltage supplied by the voltage control circuit 21. Although FIG. 4 illustrates a plurality of circuits consuming the dummy current, it is just necessary to have one circuit consuming the dummy current when it is possible to control the dummy current by just one resistor.

Specifically, the decoder 220 which is the dummy current consumption control circuit performs, based on the clock frequency of the clock signal, control to consume the dummy current by applying a voltage EN_SINKx equal to or higher than the threshold Vth by which an nMOS element Mx of the selected circuit consuming the dummy current turns on.

Referring back again to FIG. 3, the VDD_CKDIST block 20 will be described. The high-speed clock signal outputted from the PLL 18 is inputted to the glitch-free circuit 23 and the clock signal output circuit 24. In this state, when the synchronization signal TX_SYNC is inputted from the control circuit 10 to the glitch-free circuit 23, the glitch-free circuit 23 outputs a GATE_OPEN signal which is a synchronization signal to the clock signal output circuit 24. When this GATE_OPEN signal is inputted to the clock signal output circuit 24, the clock signal output circuit 24 becomes a state that the NAND gate or the clocked inverter outputs a clock, and outputs the clock signal HS_CLKx controlled with the regulator voltage VDD_CKDIST.

At a timing when this GATE_OPEN signal is inputted to the clock signal output circuit 24, the synchronization signal TX_SYNC is inputted likewise to the current control circuit 22 from the control circuit 10, and thereby the dummy current which has been consumed in the current control circuit 22 is no longer consumed. Accordingly, the value of the load current on the regulator voltage VDD_CKDIST no longer varies largely at a timing when the synchronization signal TX_SYNC is inputted, and also a large drop of the regulator voltage VDD_CKDIST will no longer happen. HS_CLKx is controlled again with the regulator voltage VDD_CKDIST by the buffer 25, and is outputted as the differential high-speed clock signals TX_HS_CKIP/TX_HS_CKIN.

On the other hand, in the VDD_TX block 50, the regulator voltage VDD_TX is generated and inputted to the divider circuit 52 by the voltage control circuit 51. The differential high-speed clock signals TX_HS_CKIP/TX_HS_CKIN outputted by the VDD_CKDIST block 20 are inputted to the divider circuit 52 of the VDD_TX block 50. In the divider circuit 52 to which the differential high-speed clock signals TX_HS_CKIP/TX_HS_CKIN are inputted, the clock signals are divided, and moreover, qualities such as voltage and slew are controlled with the regulator voltage VDD_TX. The buffer 53 adjusts the qualities such as voltage and slew of a signal outputted by the divider circuit 52 again and outputs the signal. The outputted signal DIV2P is a clock signal for parallel signals to be transmitted, and inputted together with the parallel transmission data tx_data to the PISO 60 of FIG. 2, so as to generate the serial differential transmission signals TXP/TXN, which are outputted from the serializer.

Figure 5:
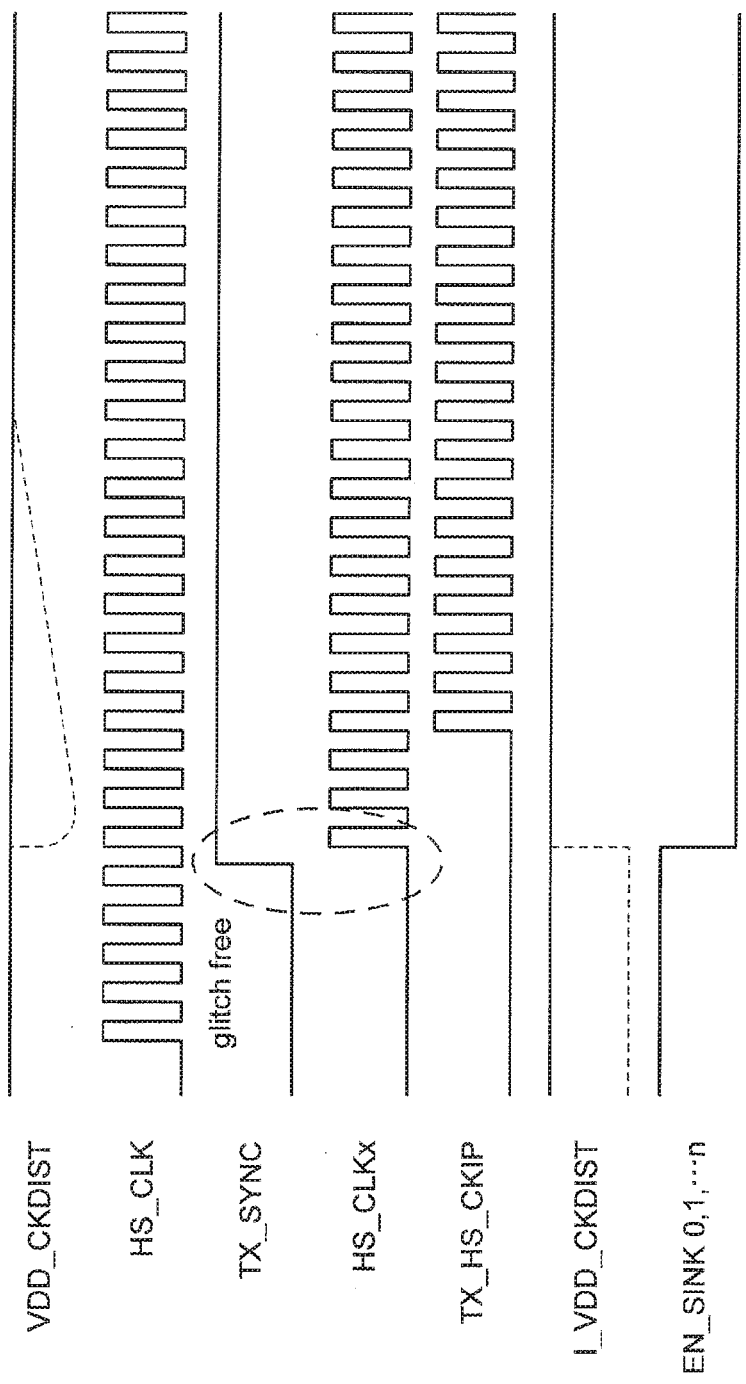
FIG. 5 is a timing chart illustrating changes in voltage and current according to the first embodiment.

FIG. 5 is a timing chart illustrating changes in voltage and current through a series of operations. The top graph illustrates a variation of the voltage of VDD_CKDIST. The high-speed clock signal HS_CLK inputted to the clock signal output circuit 24 is outputted from the buffer 25 as a high-speed clock signal HS_CLKx having no glitch at a timing when the synchronization signal TX_SYNC becomes High. In a situation that the current control circuit 22 is absent, the voltage drops as indicated by a dashed line at a timing when this high-speed clock signal HS_CLKx from which a glitch is removed is outputted. By the current control circuit 22 controlling the dummy current to allow consuming the current, this drop of voltage can be prevented. The amount of the dummy current to be consumed is controlled based on the amount of load current flowing when the clock signal HS_CLK inputted to the clock signal output circuit 24 is outputted. Then, the high-speed clock signal is converted into the differential high-speed clock signals TX_HS_CKIP/TX_HS_CKIN by the regulator without being deteriorated due to a drop voltage, and the converted signal is outputted to each transmission lane 16.

More specifically, in the situation that the current control circuit 22 is absent, the current consumed in the circuits of the regulator increases rapidly at a timing of rising of the HS_CLKx as indicated by a dashed-line portion of I_VDD_CKDIST. Accordingly, in the current control circuit 22, if the dummy current is consumed in advance by the signals EN_SINK0, EN_SINK1, ..., EN_SINKn and the flow of the dummy current is stopped at a timing when the synchronization signal TX_SYNC is inputted, this results in a state that a constant current is consumed regularly as illustrated by the graph. By controlling the consumed amount of the dummy current, the voltage of VDD_CKDIST will no longer drop at the timing when the synchronization signal TX_SYNC which makes it possible to input the high-speed clock signal to the transmitters constituting lanes is inputted. Note that the timing when the synchronization signal TX_SYNC is inputted which is mentioned here not only means a moment that TX_SYNC is inputted as a matter of course, but also is a concept including a predetermined time period before or after the moment that TX_SYNC is inputted. Hereinafter, a similar interpretation will apply regarding the timing.

As described above, according to this embodiment, in the serializer in the SerDes circuit 12 using the inter-lane synchronization circuit using the regulator, by controlling to make the load current of the regulator constant before and after the high-speed clock signal is inputted, a voltage drop of the regulator when the high-speed clock signal is outputted is suppressed, and hence inter-lane synchronization of the transmitters can be achieved. In this case, the voltage drop of the regulator can be suppressed without increasing the stabilization capacity of the regulator, and thus the circuit area of the regulator can be suppressed small. Further, suppressing the voltage drop of the regulator of high-speed clock signals distributed to each lane improves qualities of the clocks, and makes it possible to synchronize the lanes during a high-speed operation.

Figure 6:
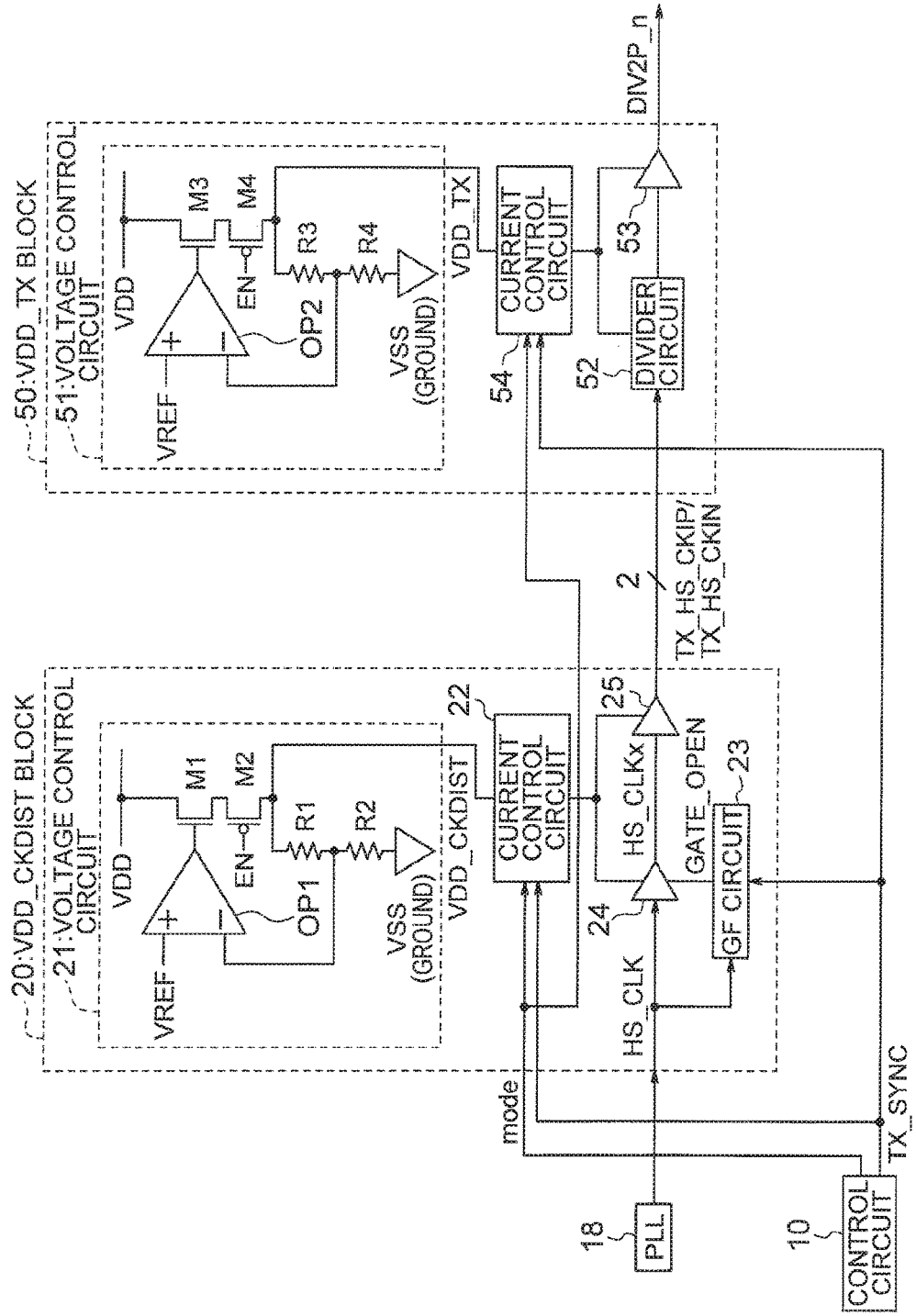
FIG. 6 is a diagram illustrating another example of circuits of the regulator according to the first embodiment.

Incidentally, although the current control circuit 22 is included only in the regulator of the VDD_CKDIST block 20 in FIG. 3, in view of a possibility that VDD_TX also drops similarly to VDD_CKDIST, a configuration including a current control circuit 54 in the regulator of the VDD_TX block 50 as illustrated in FIG. 6 can also be employed. In this case, by performing in the current control circuit 54 controls similar to the above-described control by the voltage control circuit 21, it also becomes possible to avoid a drop of the VDD_TX voltage similarly to the VDD_CKDIST voltage. In this case, the regulator of the VDD_CKDIST block 20 forms a first regulator to perform control for outputting differential clock signals which are outputted by the clock signal output circuit based on the synchronization signal, and the regulator of the VDD_TX block 50 forms a second regulator controlling the voltage of the divider circuit.

Modification Example 1 of First Embodiment

In the above-described first embodiment, there has been described the example of the configuration to consume in advance the dummy current in view of the current consumed by outputting the high-speed clock to the transmission side circuits, so as to avoid a drop of the low drop-out regulator voltage. The same clock signal may be used for circuits other than the transmission side circuits. Accordingly, this modification example will describe a configuration to utilize current consumption in circuits other than the transmission side circuits at a timing the synchronization signal is asserted, for example, circuits in a deserializer which is a reception side circuit, so as to prevent a drop of the clock signal. Parts different from the above-described first embodiment will be described in detail below.

Figure 7:
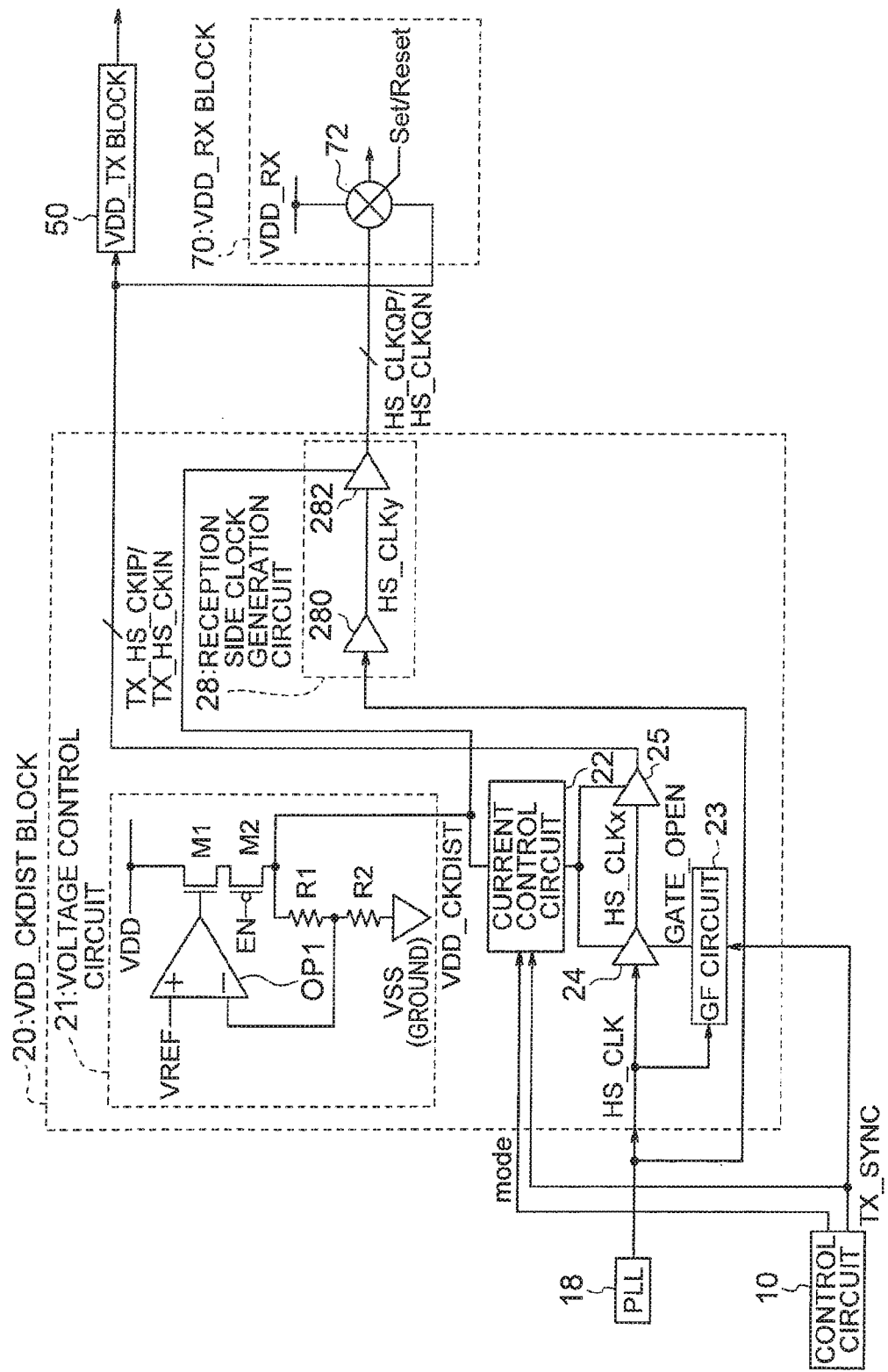
FIG. 7 is a diagram illustrating a regulator circuit according to Modification Example 1 of the first embodiment.

FIG. 7 is a diagram illustrating a VDD_CKDIST block 20, a VDD_TX block 50, and a part of a VDD_RX block 70 constituting a part of the reception side circuit in an example of this modification example. The VDD_CKDIST block 20 includes a reception side clock generation circuit 28 in addition to the configuration in the first embodiment.

The reception side clock generation circuit 28 is a circuit for generating a clock signal inputted to the receiver 40 in FIG. 2, and includes a phase converter 280 and a buffer 282. The phase converter 280 is connected between the PLL 18 and the buffer 282, and outputs a high-speed clock signal HS_CLKy obtained by delaying the phase of the high-speed clock signal HS_CLK by $\pi/2$ to the buffer 282.

The buffer 282 is connected to the phase converter 280, the voltage control circuit 21, and the VDD_RX block. This buffer 282 is substantially equivalent to the buffer 25, and is a circuit which adjusts qualities such as voltage and slew of the inputted high-speed clock signal HS_CLKy, and moreover outputs this signal as two-phase differential quadrature high-speed clock signals HS_CLKQP/HS_CLKQN. These differential quadrature high-speed clock signals HS_CLKQP/HS_CLKQN are being inputted to the VDD_RX block 70 before the synchronization signal TX_SYNC is asserted.

The VDD_RX block 70 is a circuit block provided in the receiver 40 and operating with a regulator voltage VDD_RX. One receiver 40 is provided with one VDD_RX block 70, and thus a plurality of VDD_RX blocks 70 constitute lanes, similarly to the VDD_TX block 50. This VDD_RX block 70 is provided with a phase mixer 72 generating a clock signal for latching data of a received signal.

The phase mixer 72 is a circuit mixing two groups of differential high-speed clock signals TX_HS_CKIP/TX_HS_CKIN and differential quadrature high-speed clock signals HS_CLKQP/HS_CLKQN which are orthogonal. That is, the differential high-speed clock signals TX_HS_CKIP/TX_HS_CKIN and the differential quadrature high-speed clock signals HS_CLKQP/HS_CLKQN which are delayed in phase by $\pi/2$ from these signals are inputted to the phase mixer 72, and the phase mixer 72 outputs a signal obtained by mixing these clock signals. Further, for the phase mixer 72, similarly to the VDD_RX block 70, a plurality of phase mixers 72 constitute lanes. Note that the illustration and description of other components of the VDD_RX block 70 are omitted.

Figure 8:
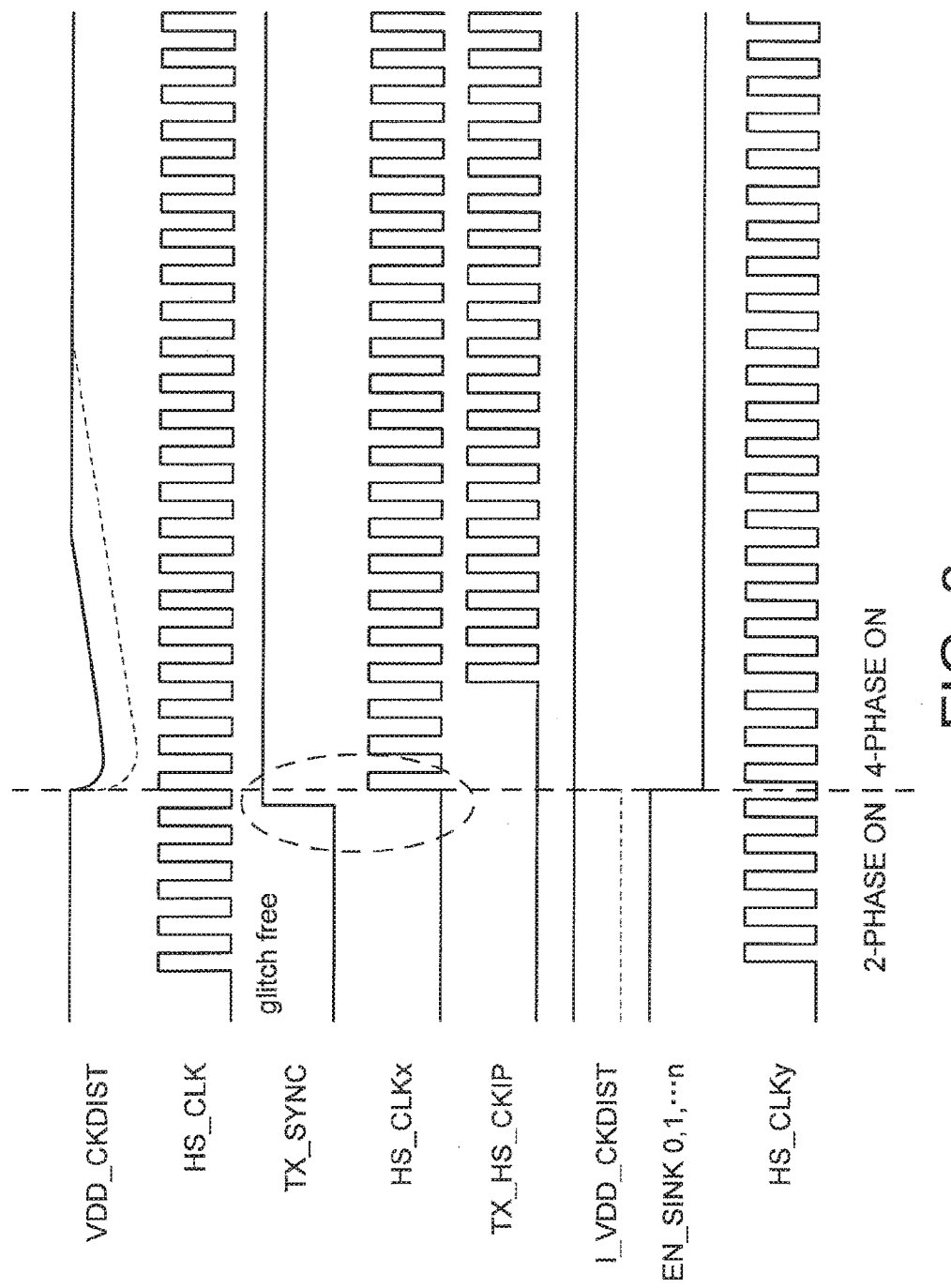
FIG. 8 is a timing chart illustrating changes in voltage and current in Modification Example 1 of the first embodiment.

Next, operation of this modification example will be described using FIG. 7 and FIG. 8. FIG. 8 is a timing chart of this modification example in operation. First, a case of assuming the high-speed clock signal TX_HS_CKIP outputted from the buffer 25 is inputted to the reception side clock generation circuit 28, instead of directly inputting the high-speed clock signal HS_CLK from the PLL 18, will be considered. In this case, at a timing when the synchronization signal TX_SYNC is asserted, quadrupled clock signals are inputted to the phase mixer 72. That is, currents rapidly flow to the phase mixer 72 at the same timing, and thus a consumed current I_VDD_CKDIST in the VDD_CKDIST block 20 increases rapidly. Accompanying this, the regulator voltage VDD_CKDIST also drops as indicated by a dashed line, making it difficult to keep the qualities of the respective clock signals.

Accordingly, the high-speed clock signal HS_CLK is inputted in advance to the reception side clock generation circuit 28 irrespective of the assertion of the synchronization signal TX_SYNC, to thereby prevent this drop of the regulator voltage. First, regardless of the timing when the synchronization signal TX_SYNC is asserted, the phase converter 280 regularly outputs a signal orthogonal to the high-speed clock signal HS_CLK, that is, the clock signal HS_CLKy obtained by delaying the phase of the high-speed clock signal HS_CLK by $\pi/2$. The buffer 282 makes the high-speed clock signal HS_CLKy inputted from the phase converter 280 be of two phases, which are two-phase differential quadrature high-speed clock signals HS_CLKQP/HS_CLKQN, and outputs them to the phase mixer 72 in advance.

In this manner, regardless of the state of the synchronization signal TX_SYNC, the differential quadrature high-speed clock signals HS_CLKQP/HS_CLKQN which are regularly delayed in phase by $\pi/2$ are outputted to the phase mixer 72 in advance. Thus, at the timing when the synchronization signal TX_SYNC is asserted, with respect to the increase in the consumed current in the circuits, it is just necessary to consider the consumed current in the circuits due to that the high-speed clock signals TX_HS_CKIP/TX_HS_CKIN are outputted to the phase mixer 72. Then, as illustrated in FIG. 8, the consumed current I_VDD_CKDIST becomes substantially constant as depicted by a solid line, and it is possible to decrease the drop of the regulator voltage VDD_CKDIST as depicted by the solid line.

As described above, according to this modification example, in the deserializer in the SerDes circuit 12 using the inter-lane synchronization circuit using the regulator, by controlling to make the load current of the regulator constant before and after the high-speed clock signal is inputted, a voltage drop of the regulator when the high-speed clock signal is outputted is suppressed, and hence inter-lane synchronization of the transmitters can be achieved. Further, also when the clock signal controlled in the VDD_CKDIST block 20 is outputted to the VDD_RX block 70, among the four-phase clock signals to be outputted, two-phase clock signals are outputted regularly in advance, and a drop of the regulator voltage occurring at the timing when the synchronization signal TX_SYNC is asserted can thereby be suppressed.

In addition, the phase mixer 72 may be configured to accept a Set/Reset signal as illustrated in FIG. 7. In this case, when the Reset signal is inputted, by controlling the output of the phase mixer 72 so that differential quadrature high-speed clock signals HS_CLKQP/HS_CLKQN components become 0, the consumed current of the clock path in the VDD_RX block 70 can be prevented from increasing in the output destination from the phase mixer 72.

Modification Example 2 of First Embodiment

In above-described Modification Example 1, the case that the four-phase clock signals are inputted to the VDD_RX block 70 has been described. In this modification example, it is configured that one clock signal among the two-phase clock signals delayed in phase by $\pi/2$ which is orthogonal to the high-speed clock signals TX_HS_CKIP/TX_HS_CKIN is not inputted to the phase mixer 72 for a predetermined time, so as to further decrease a drop of the regulator voltage. Differences from the above-described embodiment will be described in detail below.

Figure 9:
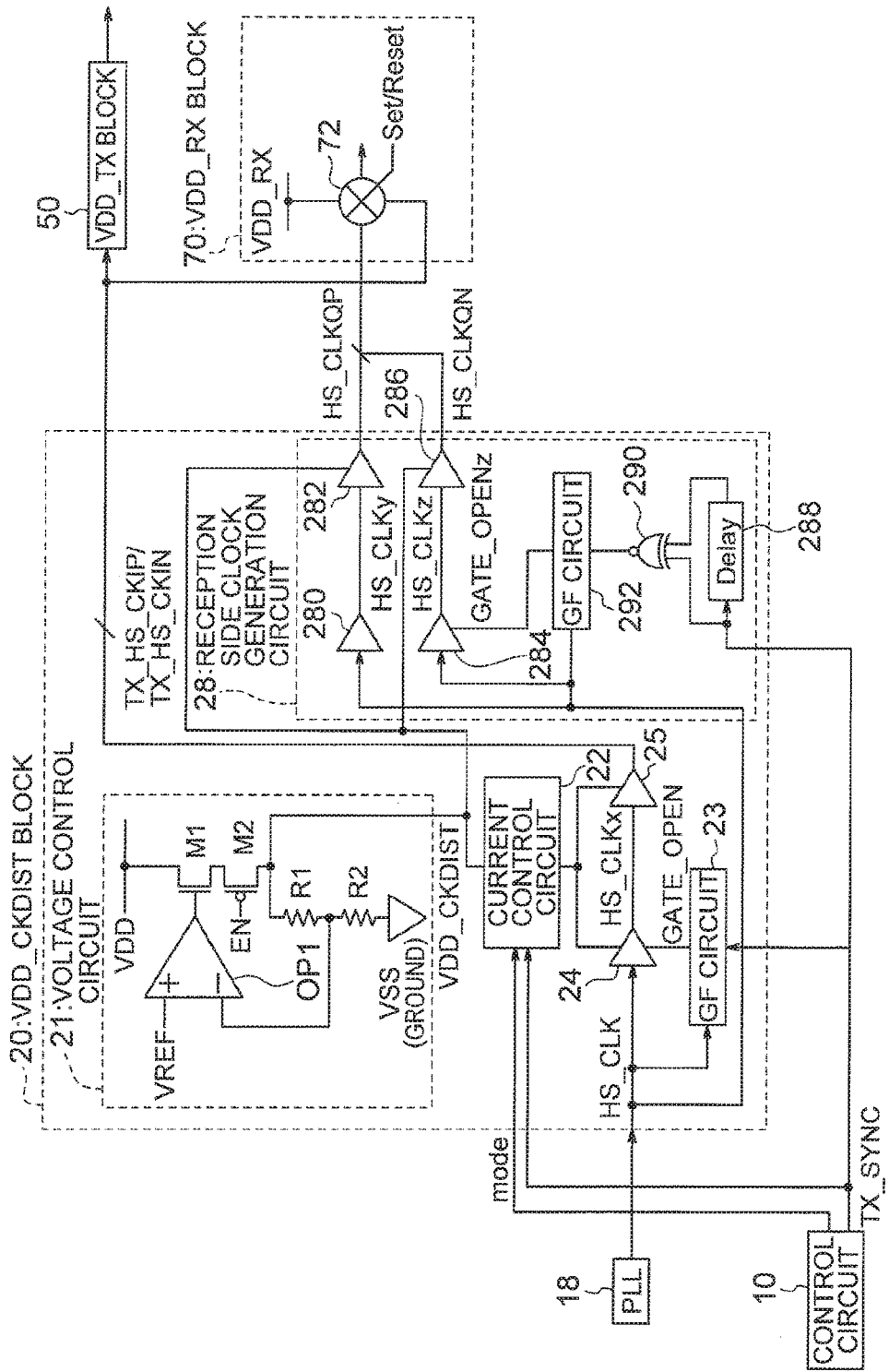
FIG. 9 is a diagram illustrating a regulator circuit according to Modification Example 2 of the first embodiment.

FIG. 9 is a diagram illustrating a circuit configuration according to this modification example. In this modification example, the reception side clock generation circuit 28 is the same as that of Modification Example 1 in that it includes the phase converter 280 and the buffer 282. The reception side clock generation circuit 28 further includes a phase converter 284, a buffer 286, a delay circuit 288, an ExNOR (Exclusive NOR) circuit 290, and a glitch-free circuit 292.

Similarly to Modification Example 1, the phase converter 280 is connected between the PLL 18 and the buffer 282 and, when the high-speed clock signal HS_CLK is inputted, outputs a high-speed clock signal HS_CLKy delayed in phase by $\pi/2$. The buffer 282 is connected to the phase converter 280, the voltage control circuit 21, and the phase mixer 72. This buffer 282 adjusts qualities such as voltage and slew, which is the same as in Modification Example 1, but here outputs a one-phase quadrature high-speed clock signal HS_CLKQP instead of the two-phase clock signals.

The phase converter 284 is connected between the PLL 18 and the buffer 286, and is further connected to the glitch-free circuit 292. This phase converter 284 is a circuit outputting, when the high-speed clock signal HS_CLK is inputted, a high-speed clock signal HS_CLKz delayed by a $3\pi/2$ phase according to an inputted GATE_OPENz signal. The buffer 286 is a circuit connected between the phase converter 284 and the phase mixer 72, adjusts qualities such as voltage and slew of the inputted high-speed clock signal HS_CLKz similarly to the buffer 282, and outputs a one-phase quadrature high-speed clock signal HS_CLKQN.

The delay circuit 288 is connected between the control circuit 10 and the ExNOR circuit 290, and delays the timing when the high-speed clock signal HS_CLKz is outputted from the phase converter 284. The ExNOR circuit 290 is connected via an input side to the control circuit 10 and the delay circuit 288 and connected via an output side to the glitch-free circuit 292. This ExNOR circuit 290 outputs High only when the synchronization signal TX_SYNC outputted from the control circuit 10 and a signal outputted by the delay circuit 288 are both High or both Low. That is, the ExNOR circuit 290 outputs a High signal before the synchronization signal TX_SYNC is outputted from the control circuit, outputs a Low signal until a delay time set in the delay circuit 288 passes since the synchronization signal TX_SYNC is outputted from the control circuit, and outputs a High signal after the delay time set in the delay circuit 288 passes.

The glitch-free circuit 292 is connected to the PLL 18, the ExNOR circuit 290, and the phase converter 284, and outputs the GATE_OPENz signal to the phase converter 284. This glitch-free circuit 292 outputs High (on) when the signal outputted by the ExNOR circuit 290 is High, and outputs Low (off) when the signal outputted by the ExNOR circuit 290 is Low. Further, when a signal to switch on or off rises or falls, the glitch-free circuit 292 outputs a signal at a timing when there is no glitch based on the high-speed clock signal HS_CLK inputted from the PLL 18.

Next, operation of the reception side clock generation circuit in this modification example will be described. First, the phase converter 280, to which the high-speed clock signal HS_CLK is inputted from the PLL 18, outputs a high-speed clock signal HS_CLKy obtained by delaying the phase of the inputted high-speed clock signal HS_CLK by $\pi/2$. The buffer 282, to which the high-speed clock signal HS_CLKy is inputted, outputs a one-phase quadrature high-speed clock signal HS_CLKQP with adjusted qualities such as voltage and slew.

In a state that the synchronization signal TX_SYNC is not asserted from the control circuit 10, a Low signal which is the synchronization signal TX_SYNC and a Low signal which is the output signal of the delay circuit 288 are inputted to the ExNOR circuit 290, and the ExNOR circuit 290 outputs a High signal. The output of the glitch-free circuit, to which the High signal is inputted, causes the GATE_OPENz signal to be on, and thus the phase converter 284 also outputs the high-speed clock signal HS_CLKz which is obtained by delaying the phase of the high-speed clock signal HS_CLK by $3\pi/2$, similarly to the phase converter 280. The buffer 286, to which the high-speed clock signal HS_CLKz is inputted, outputs a one-phase quadrature high-speed clock signal HS_CLKQN with adjusted qualities such as voltage and slew. Then, the clock signals outputted from these buffers 282, 286 are made to be of two phases and inputted to the phase mixer 72.

Figure 10:
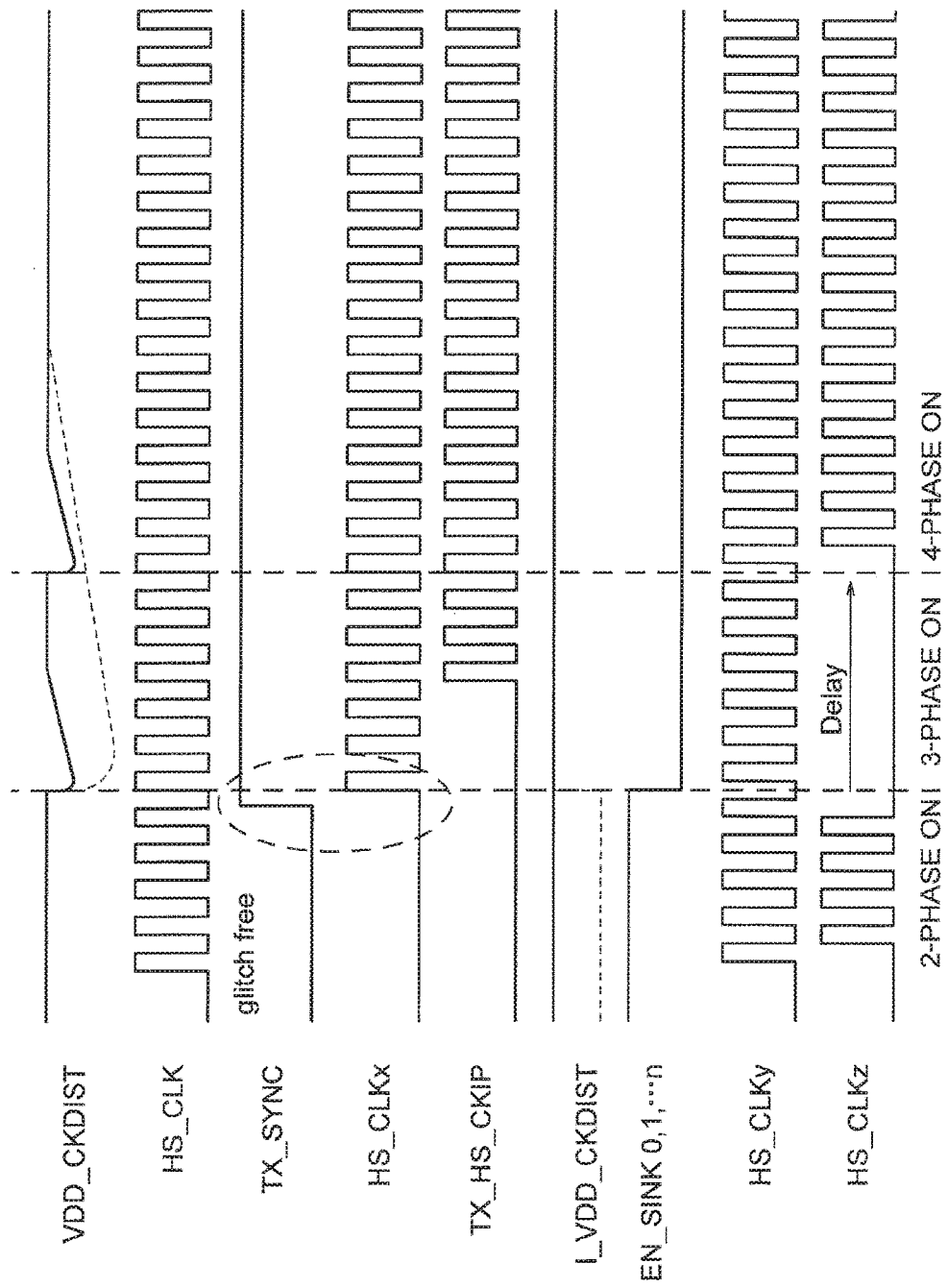
FIG. 10 is a timing chart illustrating changes in voltage and current in Modification Example 2 of the first embodiment.

In this state, when the control circuit 10 asserts the synchronization signal TX_SYNC, a High signal which is the synchronization signal TX_SYNC and a Low signal which is the output signal of the delay circuit 288 are inputted to the ExNOR circuit 290 until a predetermined time passes by the delay circuit 288, and the ExNOR circuit 290 outputs Low. The glitch-free circuit 292, to which Low is inputted, turns off the GATE_OPENz signal, and the phase converter 284 turns to a state of not outputting the high-speed clock signal HS_CLKz. FIG. 10 is a timing chart in operation of this modification example, in which the quadrature high-speed clock signal HS_CLKz is in a state of being Low and constant in this period. In this state, three-phase clock signals in total are inputted to the phase mixer 72, which are the two-phase high-speed clock signals TX_HS_CKIP/TX_HS_CKIN and the one-phase quadrature high-speed clock signal HS_CLKQP.

Next, after the delay time set in the delay circuit 288 passes, the High signal which is the synchronization signal TX_SYNC and a High signal which is the output signal of the delay circuit 288 are inputted to the ExNOR circuit 290, and thus the ExNOR circuit 290 outputs a High signal. The glitch-free circuit 292, to which the High signal is inputted, outputs the GATE_OPENz signal at a timing when there is no glitch. The phase converter 284, to which this GATE_OPENz signal is inputted, outputs the high-speed clock signal HS_CLKz again, and four-phase high-speed clock signals are inputted to the phase mixer 72.

Specifically, to the phase mixer 72, two-phase differential quadrature high-speed clock signals HS_CLKQP/HS_CLKQN are inputted before the synchronization signal TX_SYNC is asserted, three-phase clock signals TX_HS_CKIP/TX_HS_CKIN, HS_CLKQP are inputted until the predetermined time passes since the synchronization signal TX_SYNC is asserted, and quadrature four-phase clock signals TX_HS_CKIP/TX_HS_CKIN, HS_CLKQP/HS_CLKQN are inputted after the predetermined time passes since the synchronization signal TX_SYNC is asserted.

Thus, according to this modification example also, in the deserializer in the SerDes circuit 12 using the inter-lane synchronization circuit using the regulator, by controlling to make the load current of the regulator constant before and after the high-speed clock signal is inputted, a voltage drop of the regulator when the high-speed clock signal is outputted is suppressed, and hence inter-lane synchronization of the transmitters can be achieved.

Further, also when the clock signal controlled in the VDD_CKDIST block 20 is outputted to the VDD_RX block 70, among the four-phase clock signals to be outputted, two-phase clock signals are outputted regularly in advance, and a drop of the regulator voltage occurring at the timing when the synchronization signal TX_SYNC is asserted can thereby be suppressed. Moreover, by making the clock signals to be of three phases only in the predetermined time between the clock signals are changed from two-phase to four-phase, a drop of the regulator voltage can be suppressed more than by above-described Modification Example 1.

Second Embodiment

In the above-described first embodiment, the example of the configuration to consume the dummy current in advance so as to avoid a drop of the low drop out regulator voltage has been described. In a second embodiment, a configuration to control the synchronization signal transmitted by the control circuit 10 so as to avoid a drop of the low drop out regulator voltage will be described. Differences from the above-described first embodiment will be described in detail below. Note that the configuration of the SerDes circuit 12 is as illustrated in FIG. 2, similarly to the first embodiment.

Figure 11:
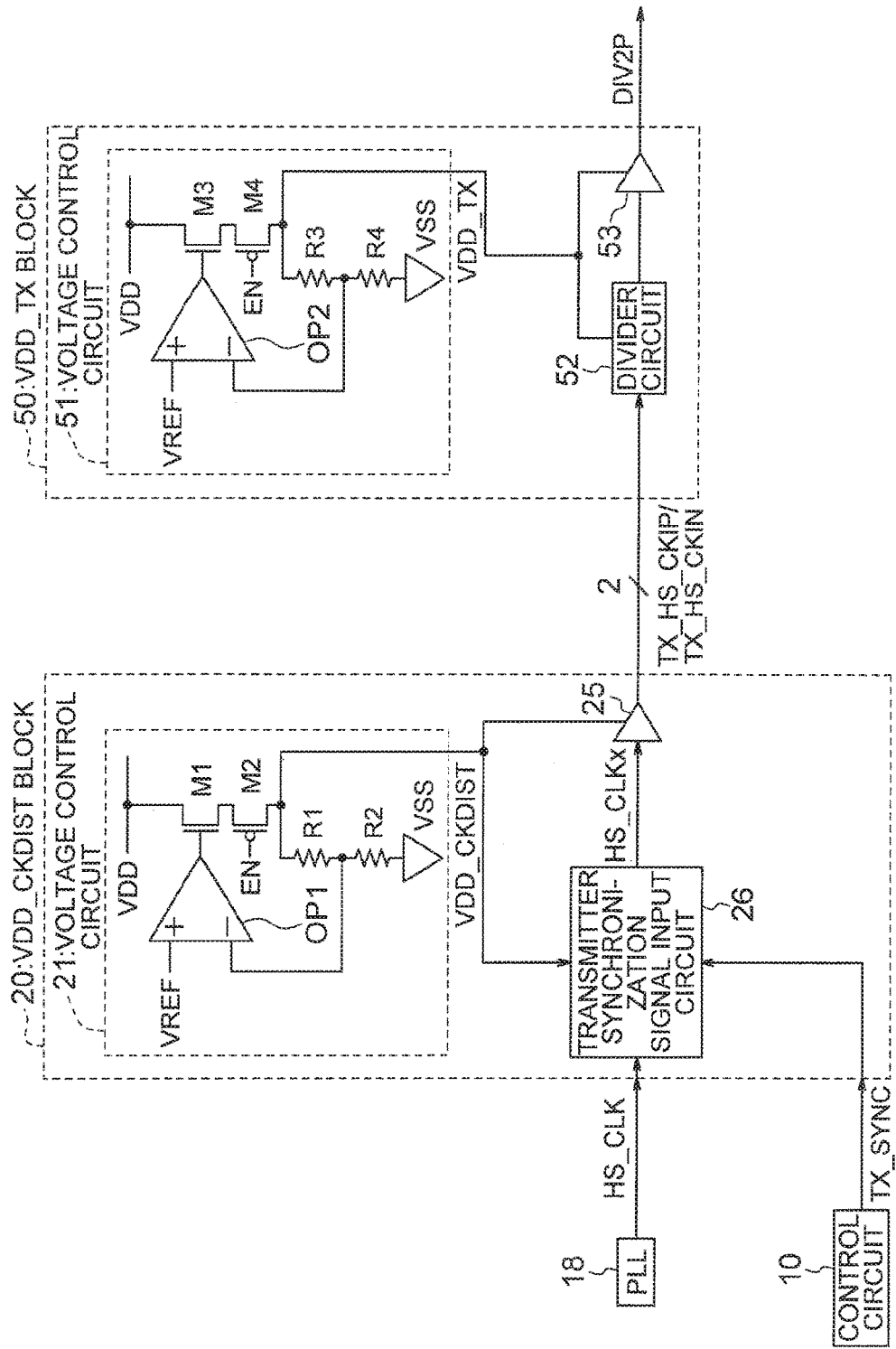
FIG. 11 is a diagram illustrating circuits of a regulator according to a second embodiment.

As illustrated in FIG. 11, a VDD_CKDIST block 20 according to this embodiment is similar to that of the above-described first embodiment in that it includes a voltage control circuit 21 and a buffer 25, but is different from that of the first embodiment in that it includes, instead of the current control circuit 22, the glitch-free circuit 23, and the clock signal output circuit 24, a transmitter synchronization signal input circuit 26 for controlling the synchronization signal TX_SYNC outputted from the control circuit 10.

Figure 12:
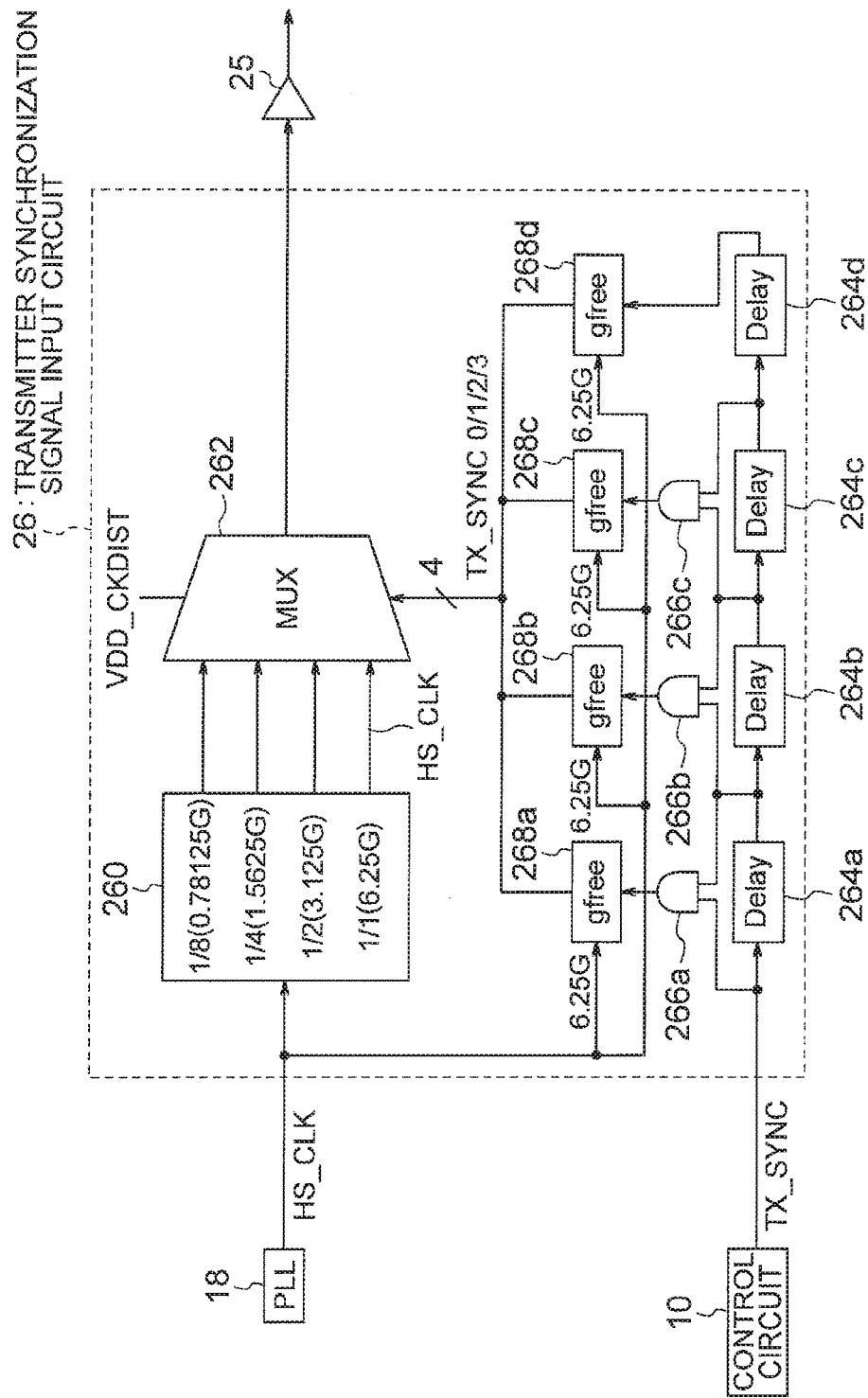
FIG. 12 is a diagram illustrating a transmitter synchronization signal input circuit according to the second embodiment.

Next, using FIG. 12, a configuration of the transmitter synchronization signal input circuit 26 will be described. The transmitter synchronization signal input circuit 26 includes a synchronous divider circuit 260, a multiplexer 262, a plurality of delay circuits 264, a plurality of AND circuits 266, and a plurality of glitch-free circuits 268.

The synchronous divider circuit 260 inputs a high-speed clock signal HS_CLK outputted from the PLL 18 and generates, for example, clock signals with frequencies obtained by dividing the high-speed clock signal HS_CLK stepwise to be 1/8, 1/4, 1/2, 1/1. The generated divided clock signals are outputted to the multiplexer 262. The multiplexer 262 outputs one of the clock signals divided by the synchronous divider circuit 260 to the buffer 25 based on synchronization signals outputted from the glitch-free circuit 268.

The delay circuits 264 are circuits for outputting the synchronization signal TX_SYNC outputted from the control circuit 10 in a manner shifted by a predetermined time, and the same number of delay circuits as the number of clock signals divided by the synchronous divider circuit 260 is provided. The AND circuits 266 are circuits for outputting the synchronization signal TX_SYNC delayed by the delay circuits 264 at the delayed timings to the glitch-free circuit 268. Then the glitch-free circuits 268 are circuits for outputting, based on the frequency of the clock signal HS_CLK inputted from the PLL 18, the synchronization signal outputted by the AND circuits 266 as synchronization signals TX_SYNC 0, 1, 2, 3 at timings when a glitch does not occur in the HS_CLKx.

Next, operation of the transmitter synchronization signal input circuit 26 will be described. When the high-speed clock signal HS_CLK is inputted from the PLL 18, the synchronous divider circuit 260 divides HS_CLK stepwise, and outputs the divided clock signals. In the example of FIG. 12, the clock signals are divided in three stages of division by 2, division by 4, and division by 8, and these divided high-speed clock signals HS_CLK and the original high-speed clock signal HS_CLK are outputted to the multiplexer 262. The multiplexer 262 is a circuit which selects an output signal, and outputs these signals to the buffer 25 according to the synchronization signal. The output is such that a selection is made from the high-speed clock signals HS_CLK divided stepwise and the high-speed clock signal HS_CLK based on a predetermined timing in order of ascending frequencies from the signal with the lowest frequency to the high-speed clock signal HS_CLK, and the selected clock signal is outputted. The outputted high-speed clock signals are controlled in voltage by the regulator similarly to the above-described first embodiment and then outputted.

In this embodiment, the output is controlled sequentially from the signal divided by 8, in order of the signal divided by 4, the signal divided by 2, and the high-speed clock signal HS_CLK itself. The synchronization signal for measuring the timing of this output is generated by the delay circuits 264, the AND circuits 266, and the glitch-free circuits 268.

The delay circuits 264 delay the synchronization signal TX_SYNC stepwise which is outputted from the control circuit 10. Each delay circuit is used for delaying one of divided high-speed clock signals HS_CLK. In other words, they are circuits for delaying by a sufficient time to allow recovery of the drop of the regulator voltage by each of the clock signals. Specifically, a delay circuit 264*a* delays the synchronization signal for a sufficient time to allow recovery of the drop of the regulator voltage by the high-speed clock signal HS_CLK divided by 8. Similarly, a delay circuit 264*b* delays the synchronization signal for a sufficient time to allow recovery of the drop by the clock signal divided by 4, a delay circuit 264*c* delays the synchronization signal for the same of the drop by the clock signal divided by 2, and a delay circuit 264*d* delays the synchronization signal for the same of the drop by the high-speed clock signal HS_CLK.

The AND circuits 266 are gate circuits for adjusting the synchronization signal outputted from each delay circuit 264. By taking a logical product of an input and an output of the delay circuit 264, each AND circuit 266 transmits a synchronization signal to the glitch-free circuit 268 when both the signals of input and output are High. The glitch-free circuit 268 which received the output from the AND circuit 266 outputs the synchronization signal at a timing when a glitch does not occur in HS_CLKx based on the clock signal HS_CLK inputted from the PLL 18. The synchronization signals TX_SYNC 0, 1, 2, 3 outputted by the glitch-free circuits 268*a*, 268*b*, 268*c*, 268*d* are inputted as selection control signals to the multiplexer 262.

Specifically, the synchronization signal TX_SYNC delayed in the delay circuit 264*a* is outputted to the multiplexer 262 as a synchronization signal TX_SYNC 0 outputted at a timing when a glitch does not occur in HS_CLKx by the glitch-free circuit 268*a*. When TX_SYNC 0 is inputted, the multiplexer 262 selects the high-speed clock signal divided by 8 which is an output signal of the synchronous divider circuit 260, and outputs this clock signal to the buffer circuit 25. Similarly, a synchronization signal TX_SYNC 1 delayed in the delay circuit 264*b* and outputted at a timing when a glitch does not occur in the HS_CLKx by the glitch-free circuit 268*b* is inputted to the multiplexer 262, the high-speed clock signal divided by 4 is selected and outputted to the buffer circuit 25 by the multiplexer 262. Regarding the high-speed clock signal divided by 2 and the high-speed clock signal HS_CLK itself, similarly with synchronization signals TX_SYNC 2, 3 outputted by the delay circuits 264*c*, 264*d* respectively being selection control signals, respective synchronization signals are outputted to the buffer circuit 25 at timings when they are inputted to the multiplexer 262.

Figure 13:
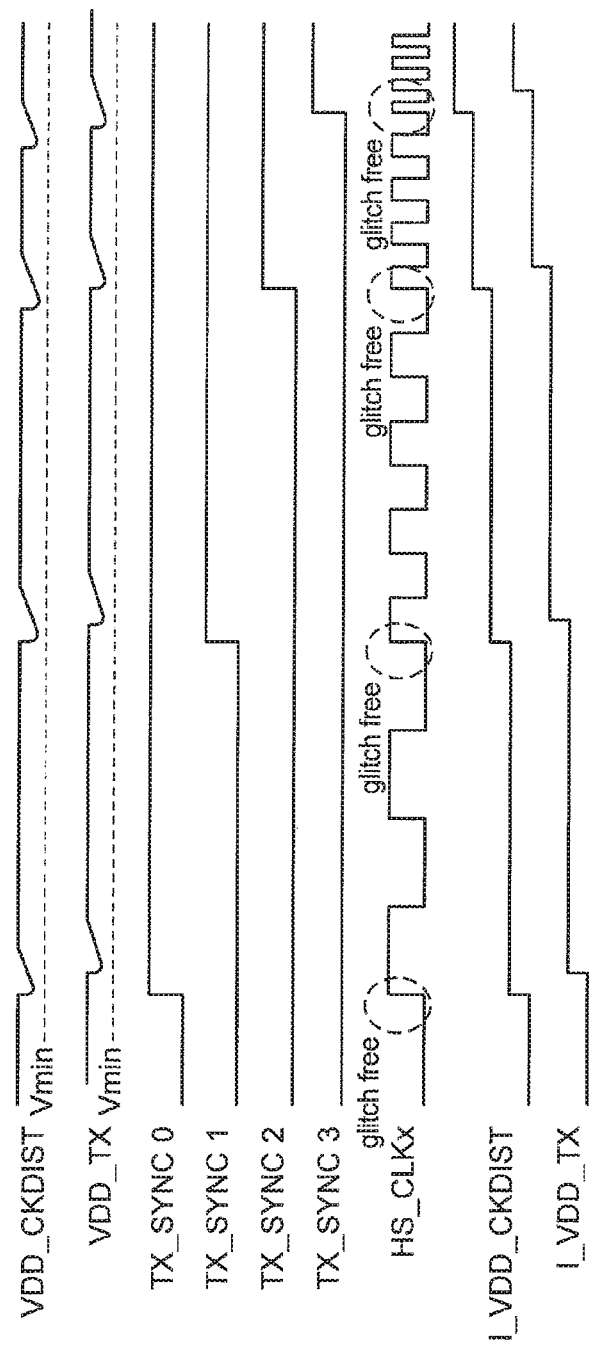
FIG. 13 is a timing chart illustrating changes in voltage and current in the second embodiment.

Next, changes in voltage and current will be described using FIG. 13. Vmin on graphs of VDD_CKDIST and VDD_TX denotes a minimum voltage for normally operating as a regulator voltage. In order to control the voltage as a high-speed clock signal used in the serializer, it will suffice to control the voltage of the regulator not to be lower than this minimum voltage Vmin. When the first synchronization signal TX_SYNC 0 is inputted, HS_CLK divided by eight is outputted. At this time, on VDD_CKDIST, the voltage drops by a load current flowing through the circuit, but becoming lower than Vmin is prevented. If one divided by 8 becomes lower than Vmin, it is conceivable to further divide the clock signal by 16 or 32. After a drop of the regulator voltage by HS_CLK divided by 8 returns to the original VDD_CKDIST, the next synchronization signal TX_SYNC 1 is inputted, and HS_CLK divided by 4 is outputted. At this time, VDD_CKDIST drops similarly, but becoming lower than Vmin is prevented. Thereafter, similarly, the synchronization signal is inputted with a time difference until the high-speed clock signal HS_CLK comes up. Thus, consequently, the high-speed clock signal HS_CLK can be outputted without the regulator voltage becoming lower than Vmin.

When the synchronization signal is inputted stepwise as described above, the flowing current is increasing gradually as indicated by I_VDD_CKDIST in the chart. Thus, by not increasing the load current rapidly it is possible to control the regulator voltage not to drop and be lower than Vmin. Note that the same applies to VDD_TX, by not increasing I_VDD_TX rapidly it is possible to control it not to be lower than Vmin as indicated on the graph.

As described above, also according to this embodiment, in the SerDes circuit 12 using the inter-lane synchronization circuit using the regulator, by controlling the load current of the regulator before and after the high-speed clock signal is inputted, a drop of the regulator voltage when the high-speed clock signal is outputted is suppressed, and hence inter-lane synchronization of the transmitters can be achieved. At this time, the voltage drop of the regulator can be suppressed without increasing the stabilization capacity of the regulator, and thus the circuit area of the regulator can be suppressed small. Further, suppressing the regulator voltage drop of high-speed clock signals distributed to each lane improves the qualities of the clocks, and makes it possible to synchronize the lanes during a high-speed operation.

Note that although all the divided input clock signals are used to control the voltage of the regulator in this embodiment, the combination of signals to be used among the clock signals divided stepwise is not limited to this. Specifically, if the clock signals are sequentially selected and outputted from one with a low frequency to one with a high frequency in the range not becoming lower than Vmin, it is unnecessary to select all the clock signals outputted from the divider, and a clock signal may be selected by picking up appropriately. Further, if the voltage does not become lower than Vmin by using the clock signal divided by 2, only two signals, the clock signal divided by 2 and the clock signal HS_CLK itself, may be used instead of dividing the clock signal stepwise. Moreover, in the above-described example, the clock signal is divided by 8, by 4, and by 2, but control of the division is not limited thereto. Any division may be employed as long as it is to control division for obtaining a necessary signal appropriately.

Third Embodiment

In the above-described second embodiment, the example in which the synchronization signal is delayed to increase the frequency of the clock signal stepwise has been described. In a third embodiment, a configuration to add a pulse signal for re-synchronizing the synchronization signal so as to suppress a drop of a voltage will be described. Differences from the above-described embodiments will be described in detail below. Note that the configuration of a SerDes circuit 12 is as illustrated in FIG. 2 similarly to the first embodiment, and the configurations of a VDD_CKDIST block 20 and a VDD_TX block 50 are as illustrated in FIG. 11 similarly to the second embodiment.

Figure 14:
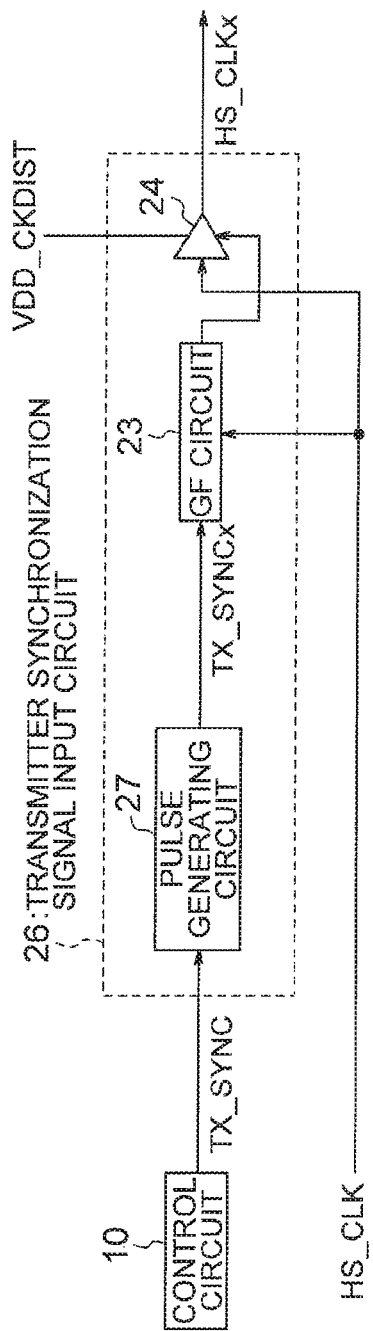
FIG. 14 is a diagram illustrating a transmitter synchronization signal input circuit according to a third embodiment.

As illustrated in FIG. 14, a transmitter synchronization signal input circuit 26 according to this embodiment includes a pulse generating circuit 27 and a glitch-free circuit 23. The pulse generating circuit 27, after the control circuit 10 outputs a synchronization signal TX_SYNC and then stops the synchronization signal TX_SYNC in a pulsed manner after a predetermined time passes, outputs a synchronization signal TX_SYNCx to restart outputting the synchronization signal TX_SYNC after a predetermined time further passes. Specifically, after the synchronization signal TX_SYNC becomes on, the pulse generating circuit 27 adds a pulse signal directed to Low from High to the synchronization signal TX_SYNC after a predetermined time passes, so as to generate a controlled synchronization signal TX_SYNCx. Specifically, the synchronization signal TX_SYNCx is such a signal that becomes Low only for a minute time after a predetermined time passes after the synchronization signal TX_SYNC becomes on. A regulator having a similar configuration to that of the above-described second embodiment controls output of a high-speed clock signal HS_CLK based on this controlled synchronization signal TX_SYNCx.

Figure 15:
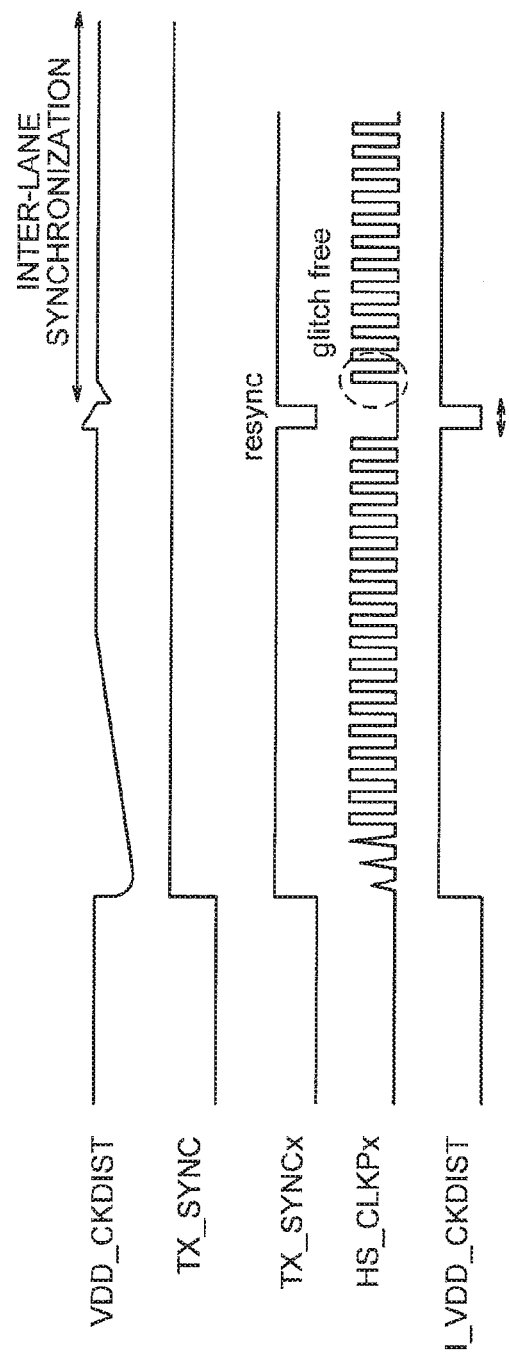
FIG. 15 is a timing chart illustrating changes in voltage and current in the third embodiment.

Using FIG. 15, changes in voltage and current according to this embodiment will be described together with operation of the transmitter synchronization signal input circuit 26. In this embodiment, the synchronization signal TX_SYNC is asserted a sufficient time before the high-speed clock signal HS_CLK is originally desired to be outputted. Accordingly, at a point when the synchronization signal TX_SYNC is asserted, the regulator voltage VDD_CKDIST drops by a rapid increase in the load current I_VDD_CKDIST. Then, at the timing of this drop of the regulator voltage VDD_CKDIST, the waveform of the high-speed clock signal HS_CLKx is disturbed. Note that in FIG. 15, a high-speed clock signal HS_CLKNx is a differential signal paired with HS_CLKPx, and hence its graph is omitted. After a sufficient time for recovery of this drop passes, that is, after the high-speed clock signal HS_CLKx returns to a normal signal, if output of the high-speed clock signal HS_CLKx can be stopped for a minute time and then outputted again, it is possible to suppress the drop of the regulator voltage VDD_CKDIST.

For this purpose, just before the timing the high-speed clock signal HS_CLKx is outputted, a pulse signal resync directed from High to Low is added to the synchronization signal TX_SYNC. This pulse signal resync causes that the output of high-speed clock signals HS_CLKPx/HS_CLKNx is temporarily stopped, the load current I_VDD_CKDIST flowing through the circuits decreases, and thus the regulator voltage VDD_CKDIST increases. When the synchronization signal TX_SYNCx which temporarily became Low by the pulse signal resync becomes High again, the high-speed clock signals HS_CLKPx/HS_CLKNx are outputted again. At this time, the load current I_VDD_CKDIST flowing through the circuits increases, and thus the regulator voltage VDD_CKDIST drops. However, if the pulse width of this pulse signal resync is so small that a regulator response cannot follow, it is possible to suppress the drop of the voltage similarly to the state of the regulator voltage VDD_CKDIST illustrated in FIG. 15.

As described above, also according to this embodiment, in the SerDes circuit 12 using the inter-lane synchronization circuit using the regulator, by outputting again the high-speed clock signal which has been outputted in advance by using the synchronization signal to which the pulse signal in a direction from High to Low is added, a drop of the regulator voltage when the high-speed clock signal is outputted is suppressed, and hence inter-lane synchronization of the transmitters can be achieved.

Fourth Embodiment

In the above-described third embodiment, the example in which the drop of the regulator voltage is suppressed by controlling the synchronization signal has been described. In a fourth embodiment, a configuration is employed in which although a regulator voltage drops by controlling the regulator voltage, a regulator voltage necessary for synchronization between lanes is secured. Differences from the above-described embodiments will be described in detail below. Note that the configuration of a SerDes circuit 12 is as illustrated in FIG. 2 similarly to the first embodiment.

Figure 16:
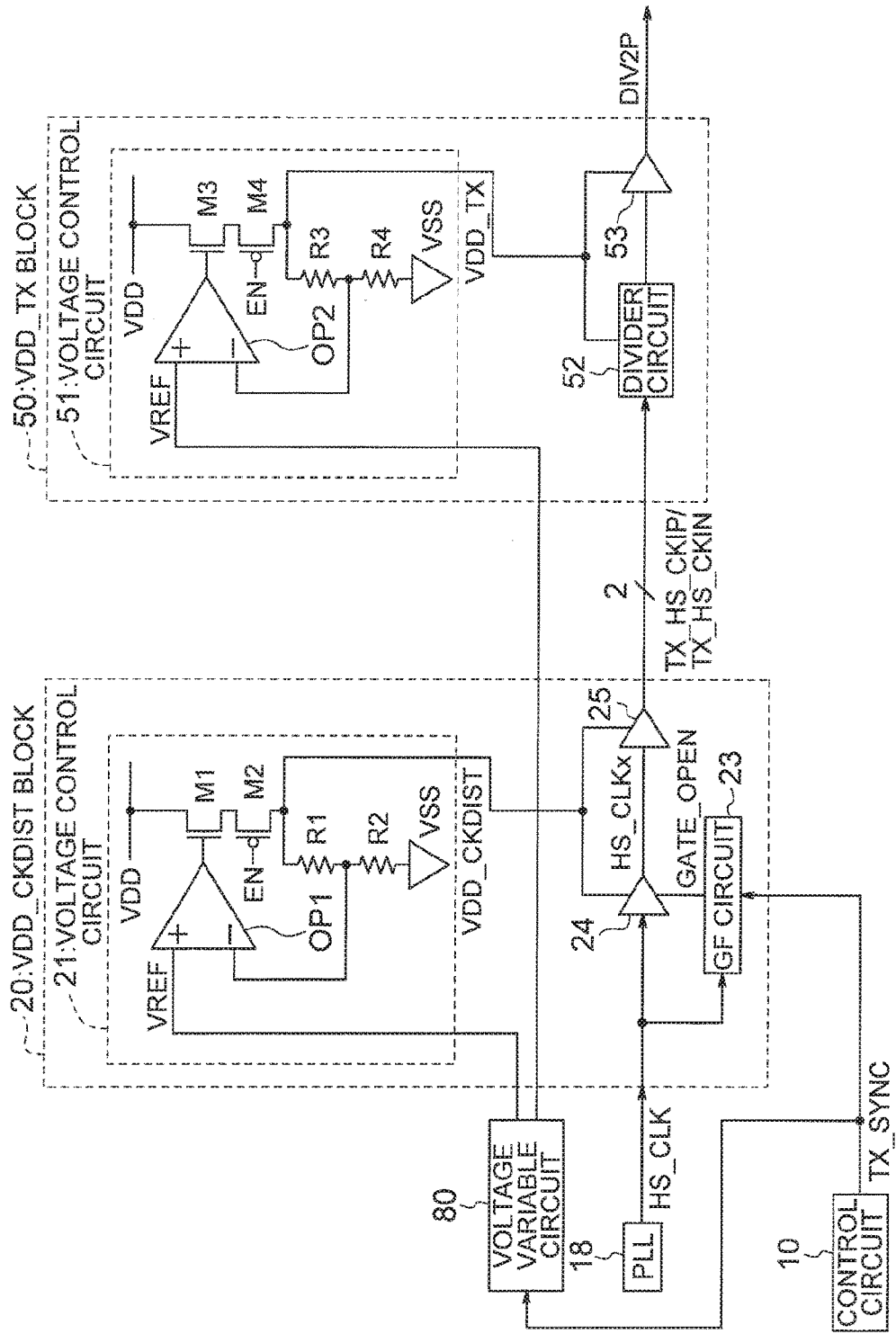
FIG. 16 is a diagram illustrating circuits of a regulator according to a fourth embodiment.

As illustrated in FIG. 16, configurations of a VDD_CKDIST block 20 and a VDD_TX block 50 according to this embodiment includes a voltage variable circuit 80 for controlling the reference voltage VREF inputted to the voltage control circuits 21, 51 of the regulator.

Figure 17:
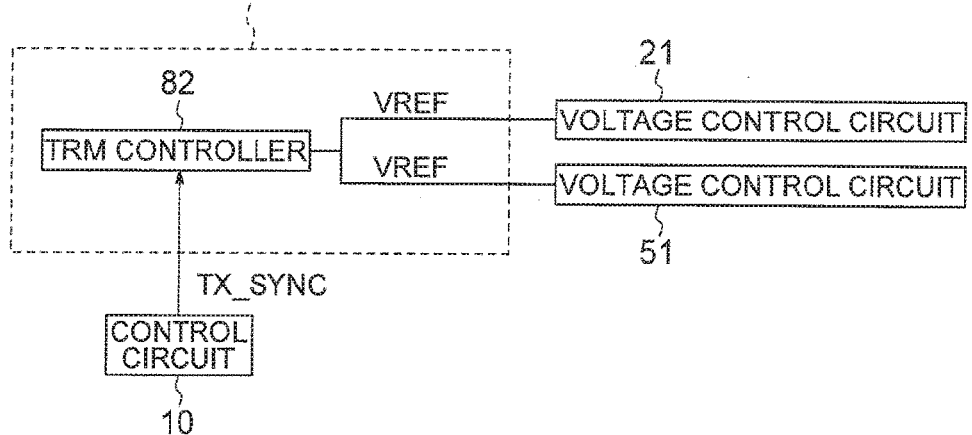
FIG. 17 is a diagram illustrating a voltage variable circuit according to the fourth embodiment.

As illustrated in FIG. 17, the voltage variable circuit 80 includes an output voltage controller 82. This output voltage controller 82 sets the reference voltage of the regulator higher by a predetermined value than a normal value in advance a predetermined time before the synchronization signal is outputted. Then, after the synchronization signal is outputted and the voltage and the current become stable, the voltage variable circuit 80 lowers the value of the reference voltage of the regulator. This control of the voltage is achieved by, for example, controlling the output from the TRM terminal. Hereinafter, using FIG. 18, operation of the voltage variable circuit 80 will be explained.

By setting the reference voltage VREF higher by the voltage variable circuit 80 before the synchronization signal TX_SYNC is inputted, the regulator voltage VDD_CKDIST is increased to a level which enables synchronization among lanes sufficiently even if a drop occurs. When the synchronization signal TX_SYNC is inputted, due to a rapid increase in the load current I_VDD_CKDIST flowing through the circuits, the regulator voltage VDD_CKDIST drops but does not become lower than Vmin. At this time, as illustrated in the chart, the high-speed clock signal TX_HS_CKIP is transmitted to a transmitter 30 without deterioration. However, keeping the regulator voltage VDD_CKDIST high after the regulator voltage VDD_CKDIST became stable is not reasonable in view of power consumption. Accordingly, after the regulator voltage VDD_CKDIST became stable, the voltage variable circuit 80 lowers the reference voltage VREF stepwise within a range in which the regulator voltage VDD_CKDIST does not become lower than Vmin.

The same applies to the regulator voltage VDD_TX, by controlling the reference voltage VREF not to be lower than Vmin, synchronization among lanes is possible even if a drop of the regulator voltage VDD_TX by the load current I_VDD_TX occurs. The timing when the reference voltage VREF is lowered to decrease the regulator voltage VDD_CKDIST and the regulator voltage VDD_TX can be set individually to be after the voltages of the respective circuits become stable.

Figure 18:
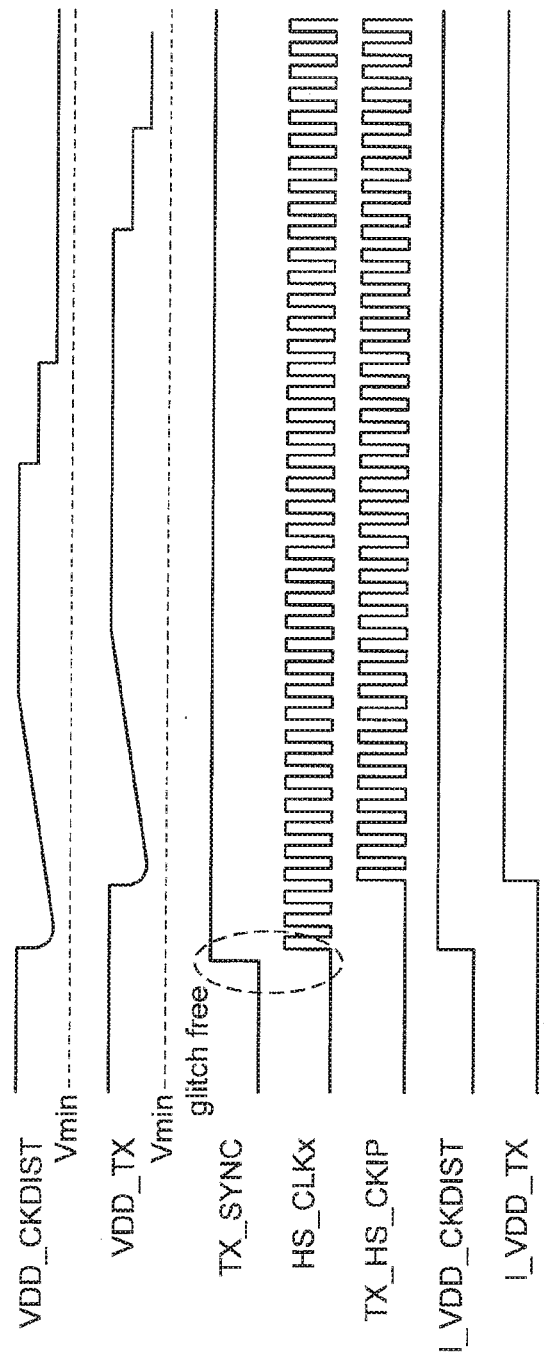
FIG. 18 is a timing chart illustrating changes in voltage and current in the fourth embodiment.

As described above, also according to this embodiment, in the SerDes circuit 12 using the inter-lane synchronization circuit using the regulator, by controlling the regulator voltage so that the voltage which drops when the high-speed clock signal is outputted does not become lower than Vmin, inter-lane synchronization of the transmitters can be achieved. Note that although the configuration in FIG. 18 is to lower the voltage stepwise, any configuration is possible as long as it does not lower the voltage rapidly. For example, a configuration to lower the voltage sequentially may be employed. Further, even when the reference voltage is lowered rapidly, if the regulator voltage does not become lower than Vmin due to a transient response or the like, it may be dropped to a normal voltage by one time of control.

Fifth Embodiment

In the above-described fourth embodiment, the example in which the regulator voltage is increased in advance has been described. In a fifth embodiment, a configuration is employed in which a dummy current is supplied at a timing when the synchronization signal is inputted to the output of the regulator, and the supply of the dummy current is stopped stepwise after the synchronization signal is inputted, so as to secure the regulator voltage needed for synchronization among lanes. Differences from the above-described embodiments will be described in detail below. Note that the configuration of a SerDes circuit 12 is as illustrated in FIG. 2 similarly to the first embodiment, and the configurations of a VDD_CKDIST block 20 and a VDD_TX block 50 are as illustrated in FIG. 3 similarly to the first embodiment.

Figure 19:
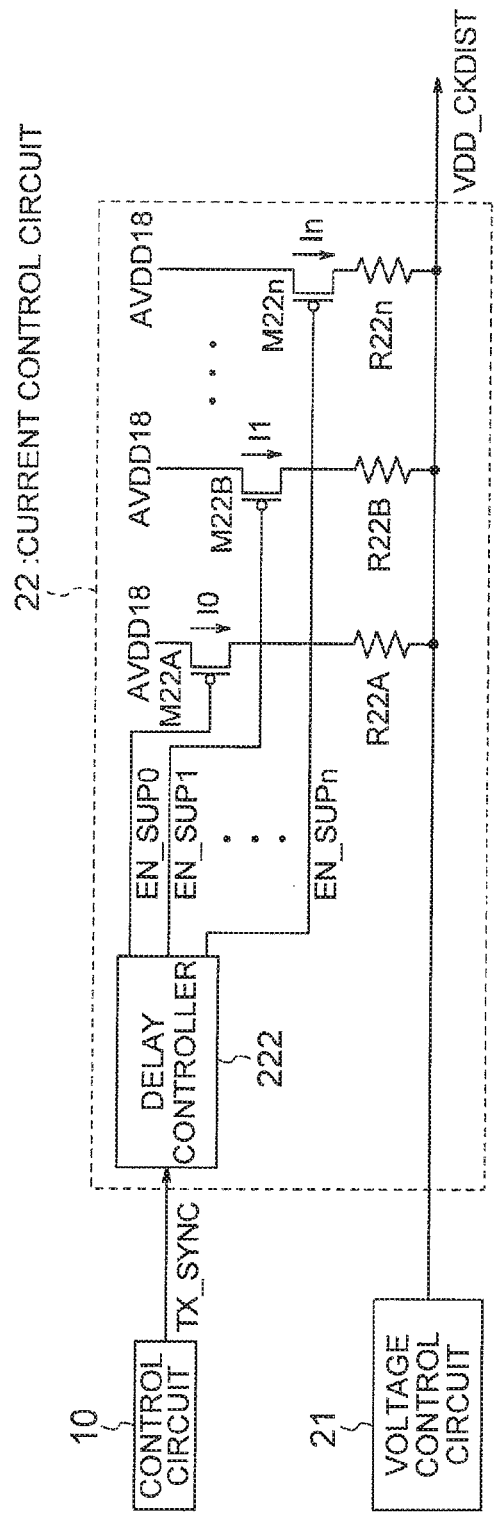
FIG. 19 is a diagram illustrating a voltage control circuit according to a fifth embodiment.

FIG. 19 is a diagram illustrating the configuration of a current control circuit 22 according to this embodiment. The current control circuit 22 supplies a dummy current to the voltage outputted by the voltage control circuit 21 at a timing based on the synchronization signal TX_SYNC, and includes a delay controller 222, a power supply VDD 22, a plurality of pMOS elements M22A, B, . . . , n, and a plurality of resistors R22A, B, . . . , n. The delay controller 222 is a controller for starting supplying the dummy current based on the synchronization signal TX_SYNC, and controlling to stop supplying the dummy current stepwise after the synchronization signal is inputted. The power supply VDD 22 is a power supply used for adding the dummy current. The pMOS element M22A is connected between the power supply VDD 22 and the resistor R22A and has a gate terminal connected to the delay controller 222. This pMOS element M22A is a switch for allowing a current to flow to the resistor R22A, and on/off of the switch is controlled by the delay controller. The resistor R22A is a resistor to which a voltage is applied and which allows a current to flow. The pMOS elements M22B, . . . , n and the resistors R22B, . . . , n exhibit the same operation as the pMOS elements M22A and the resistor R22A.

Figure 20:
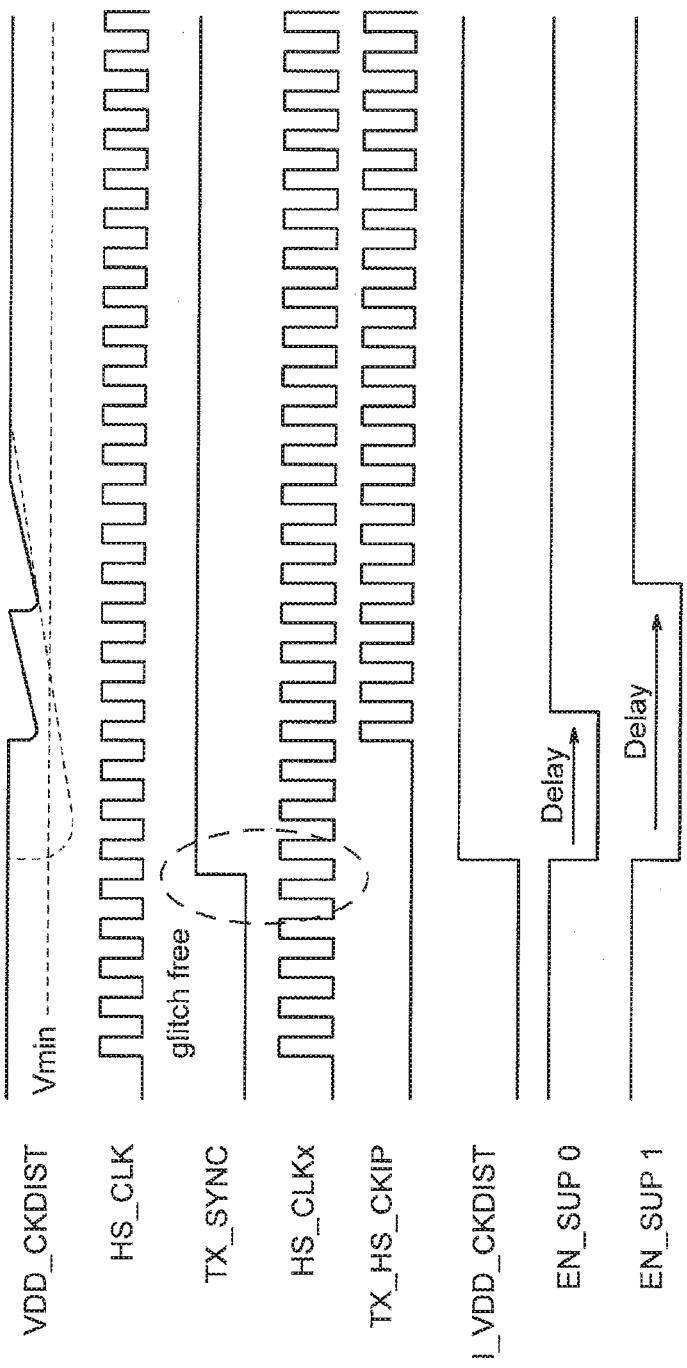
FIG. 20 is a timing chart illustrating changes in voltage and current in the fifth embodiment.

Hereinafter, using FIG. 19 and FIG. 20, operation of the current control circuit 22 will be described. The delay controller 222 controls the voltage applied to the gates of the pMOS elements M22A, B, . . . , n to be Low when the synchronization signal TX_SYNC is inputted from the control circuit 10. Through the pMOS elements M22A, B, . . . , n with the voltage at the gates being Low, currents I0, I1, . . . , In flow, and a current is supplied to the voltage VDD_CKDIST outputted by the voltage control circuit 21. By setting the sum of I0, I1, . . . , In to a value equal to the load current flowing through the circuits when the high-speed clock signal HS_CLK is outputted to the lane 16, the value of the load current flowing through the circuits is controlled not to change before and after the synchronization signal TX_SYNC is inputted.

By this control, the regulator voltage VDD_CKDIST is prevented from causing a drop by the load current. In FIG. 20, when the dummy current is not supplied, VDD_CKDIST drops as indicated by a dashed line, but supplying the dummy current prevents, as indicated by a solid line, the voltage from becoming lower than Vmin. Then, at a timing when VDD_CKDIST becomes stable, the delay controller 222 sets EN_SUP 0, 1, ..., n to be a voltage equal to or higher than a threshold voltage with a time difference, so as to turn off the pMOS elements M22A, B, ..., n sequentially. At this time, if all the gates are turned off simultaneously, the current flowing through the circuit decreases rapidly, and thus the regulator voltage VDD_CKDIST drops to be equal to or lower than Vmin. To avoid this, the delay controller 222 controls the timing to apply the voltages of EN_SUP 0, 1, ..., n so that the drop by the dummy current supplied to VDD_CKDIST does not become large. For example, as indicated by the graphs of EN_SUP 0 and EN_SUP 1 illustrated in FIG. 20, EN_SUP 1 is applied at a timing when the drop of the regulator voltage VDD_CKDIST by stopping supply of the dummy current I0 becomes stable, so as to control stopping supply of the dummy current I1.

As described above, also according to this embodiment, in the SerDes circuit 12 using the inter-lane synchronization circuit using the regulator, by supplying the dummy current equal to the load current flowing through the circuits at a timing when the high-speed clock signal is outputted, a drop of the regulator voltage is suppressed, and inter-lane synchronization of the transmitters can be achieved. Further, the circuit configuration is illustrated as an example in the diagram, and any circuit configuration may be employed as long as it exhibits similar operation. For example, VDD 22 may be any power supply as long as it can be used normally.

Note that the example in which the synchronization signal becomes active when it is High is presented in all of the above-described embodiments, but this is not restrictive, and a synchronization signal which becomes active when it is Low may be employed. In this case, in the above description, High and Low of the synchronization signal should be read by appropriately interchanged with each other. Further, the multiplexed signals are omitted in some part for the purpose of description, but using multiplexed signals as necessary is not departing from the range of the spirit of the present invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A regulator comprising:
    a voltage control circuit to supply a voltage;
    a clock signal output circuit to output a clock signal controlled by the voltage supplied from the voltage control circuit; and
    a current control circuit to supply the voltage supplied from the voltage control circuit to the clock signal output circuit, the current control circuit making to flow a dummy current which is determined based on the voltage, and stopping flowing the dummy current at a timing when the clock signal output circuit outputs the clock signal.

2. The regulator according to claim 1, wherein the current control circuit controls an amount of the dummy current based on an amount of a load current flowing when the clock signal output circuit output the clock signal without being controlled.

3. The regulator according to claim 1, wherein the current control circuit controls the amount of the dummy current based on a clock frequency of the clock signal inputted into the clock signal output circuit.

4. The regulator according to claim 3, wherein the current control circuit comprises one or a plurality of dummy current flowing circuits to allow the dummy current to flow from an output of the current control circuit.

5. The regulator according to claim 4, further comprising a dummy current flowing control circuit to select one or plurality of the dummy current flowing circuits based on the clock frequency of the clock signal so as to control the amount of the dummy current.

6. The regulator according to claim 5, wherein each of the dummy current flowing circuits comprises a resistor and an nMOS transistor being connected in series.

7. The regulator according to claim 6, wherein each of the dummy current flowing control circuits controls flow of the dummy current by applying a voltage to a gate of the nMOS transistor of the selected dummy current flowing circuits based on the clock frequency of the inputted clock signal.

8. A serializer comprising:
    a control circuit to output a mode signal based on a clock frequency of an inputted clock signal and a synchronization signal;
    the regulator according to claim 1 wherein the clock signal output circuit outputs differential clock signals controlled based on the synchronization signal; and
    a plurality of divider circuits constituting lanes, the divider circuits dividing a signal outputted from the regulator.

9. A serializer comprising:
    a control circuit to output a mode signal based on a clock frequency of an inputted clock signal and a synchronization signal;
    a first regulator according to claim 1, wherein the clock signal output circuit controls differential clock signals outputted based on the synchronization signal;
    a plurality of divider circuits constituting lanes, the divider circuits dividing a signal outputted from the regulator; and
    a second regulator according to claim 1, the second regulator controlling voltages of the divider circuits.

10. A deserializer comprising:
    a control circuit to output a mode signal based on a clock frequency of an inputted clock signal and a synchronization signal;
    the regulator according to claim 1, wherein the clock signal output circuit outputs differential clock signals controlled based on the synchronization signal; and
    a plurality of phase mixers to mix the differential clock signals controlled in the regulator and phases of differential quadrature clock signals orthogonal to the differential clock signals, the phase mixers constituting lanes.

11. The deserializer according to claim 10, wherein the differential quadrature clock signals are inputted to the phase mixers irrespective of a state of the synchronization signal.

12. The deserializer according to claim 10, wherein:
    both of two clock signals included in the differential quadrature clock signals are inputted to the phase mixers when the synchronization signal is not outputted,
    when the synchronization signal is outputted, input of one of the two clock signals included in the differential quadrature clock signals is continued and input of the other of the two clock signals is stopped for a predetermined time since the synchronization signal is outputted, and
    after the predetermined time passes, input of the other of the two clock signals included in the differential quadrature clock signals is started.

13. A serializer/deserializer circuit comprising a serializer and a deserializer, wherein the serializer comprises:
    a control circuit to output a mode signal based on a clock frequency of a clock signal and a synchronization signal;
    the regulator according to claim 1, wherein the clock signal output circuit outputs differential clock signals controlled based on the synchronization signal; and
    a plurality of divider circuits constituting first lanes, the divider circuits dividing a signal outputted from the regulator, and
    wherein the deserializer comprises a plurality of phase mixers constituting second lanes, the phase mixers mixing the differential clock signals controlled in the regulator and phases of differential quadrature clock signals orthogonal to the differential clock signals.

14. The serializer/deserializer circuit according to claim 13, wherein the differential quadrature clock signals are inputted to the phase mixers irrespective of a state of the synchronization signal.

15. The serializer/deserializer circuit according to claim 13, wherein both of two clock signals included in the differential quadrature clock signals are inputted to the phase mixers when the synchronization signal is not outputted;
    when the synchronization signal is outputted, input of one of the two clock signals included in the differential quadrature clock signals is continued and input of the other of the two clock signals is stopped for a predetermined time since the synchronization signal is outputted; and
    after the predetermined time passes, input of the other of the two clock signals included in the differential quadrature clock signals is started.

16. A serializer comprising:
    a divider circuit to divide an input clock signal and to output a plurality of clock signals having frequencies different from each other;
    an output signal selection circuit to sequentially select from a clock signal having a low frequency toward a clock signal having a high frequency out of the plurality of clock signals and outputs the selected clock signal; and
    a regulator to control and to output a voltage of a clock signal outputted by the output signal selection circuit.

17. A method for controlling a regulator, the method comprising the steps of:
    supplying a predetermined voltage from a voltage control circuit to a current control circuit;
    outputting a clock signal controlled by the supplied voltage from a clock signal output circuit; and
    supplying the clock signal output circuit with the voltage supplied from the voltage control circuit, wherein a dummy current which is determined based on the voltage is made to flow and the flow of the dummy current is stopped at a timing when the clock signal output circuit outputs the clock signal.

* * * * *